(12) United States Patent
Matsumoto et al.

(10) Patent No.: US 9,595,425 B2
(45) Date of Patent: *Mar. 14, 2017

(54) ANTENNA, DIELECTRIC WINDOW, PLASMA PROCESSING APPARATUS AND PLASMA PROCESSING METHOD

(75) Inventors: Naoki Matsumoto, Miyagi (JP); Wataru Yoshikawa, Miyagi (JP); Jun Yoshikawa, Miyagi (JP); Kazuki Moyama, Miyagi (JP); Kiyotaka Ishibashi, Miyagi (JP); Osamu Morita, Miyagi (JP); Takehiro Tanikawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 182 days.

This patent is subject to a terminal disclaimer.

(21) Appl. No.: 13/541,940

(22) Filed: Jul. 5, 2012

(65) Prior Publication Data
US 2013/0008607 A1  Jan. 10, 2013

(30) Foreign Application Priority Data
Jul. 6, 2011  (JP) .................. 2011-150365

(51) Int. Cl.
C23C 16/00 (2006.01)
C23F 1/00 (2006.01)
H01L 21/306 (2006.01)
H01J 37/32 (2006.01)

(52) U.S. Cl.
CPC .............. H01J 37/32238 (2013.01)

(58) Field of Classification Search
CPC ...................... H01J 37/32238; H01J 37/32192

USPC .............................. 156/345.41; 118/723 MW
See application file for complete search history.

(56) References Cited

U.S. PATENT DOCUMENTS

| | | | |
|---|---|---|---|
| 9,111,726 B2* | 8/2015 | Moyama | H01J 37/32192 |
| 2007/0113788 A1* | 5/2007 | Nozawa et al. | 118/723 MW |
| 2007/0175391 A1 | 8/2007 | Mizusawa | |
| 2008/0138996 A1* | 6/2008 | Nishizuka | 438/726 |
| 2009/0242130 A1* | 10/2009 | Tian | H01J 37/32192 156/345.41 |

(Continued)

FOREIGN PATENT DOCUMENTS

| | | |
|---|---|---|
| CN | 101013660 A | 8/2007 |
| JP | 2007-250838 A | 9/2007 |

(Continued)

*Primary Examiner* — Rakesh Dhingra
(74) *Attorney, Agent, or Firm* — Brundidge & Stanger, P.C.

(57) ABSTRACT

An antenna, a dielectric window, a plasma processing apparatus and a plasma processing method are capable of improving uniformity of a substrate surface processing amount in the surface of the substrate. The antenna includes the dielectric window 16; and a slot plate 20, provided on one side of the dielectric window 16, having a plurality of slots 133. The dielectric window 16 has a flat surface 146 surrounded by a ring-shaped first recess; and a plurality of second recesses 153 formed on the flat surface 146 so as to surround a center of the flat surface 146. Here, the flat surface 146 is formed on the other side of the dielectric window 16. When viewed from a thickness direction of the slot plate 20, a center of each second recess 153 is located within each slot 133 of the slot plate.

8 Claims, 16 Drawing Sheets

(56) References Cited

U.S. PATENT DOCUMENTS

| | | | |
|---|---|---|---|
| 2010/0101728 A1* | 4/2010 | Iwasaki | 156/345.33 |
| 2010/0279512 A1* | 11/2010 | Udea et al. | 438/726 |
| 2011/0057562 A1* | 3/2011 | Chen et al. | 315/39 |
| 2012/0190208 A1* | 7/2012 | Ozu et al. | 438/710 |
| 2013/0093321 A1* | 4/2013 | Yoshikawa et al. | 315/39 |

FOREIGN PATENT DOCUMENTS

| | | | | |
|---|---|---|---|---|
| JP | 2008-047687 | | 2/2008 | |
| JP | WO 2009063755 | * | 5/2009 | ........... C23C 16/511 |
| JP | 2010-118549 | | 5/2010 | |
| JP | 2011-029416 | | 2/2011 | |
| JP | WO 2011021539 | * | 2/2011 | ......... H01L 21/3065 |
| JP | WO2011125524 | * | 10/2011 | ........... H01L 21/205 |
| WO | 2011021539 A1 | | 2/2011 | |
| WO | 2011031571 A1 | | 3/2011 | |

\* cited by examiner (a)

(b)

ANTENNA, DIELECTRIC WINDOW, PLASMA PROCESSING APPARATUS AND PLASMA PROCESSING METHOD

CROSS-REFERENCE TO RELATED APPLICATION

This application claims the benefit of Japanese Patent Application No. 2011-150365 filed on Jul. 6, 2011, the disclosures of which are incorporated herein by reference.

FIELD OF THE INVENTION

The present disclosure relates to an antenna, a dielectric window, a plasma processing apparatus and a plasma processing method for use in processing a substrate by plasma excited from a processing gas introduced into a processing chamber.

BACKGROUND OF THE INVENTION

Conventionally, a plasma processing apparatus has been used in various fields. Patent Document 1 describes a plasma etching apparatus using parallel plates for generating plasma.

Recently, there has been developed a plasma etching apparatus using a radial line slot antenna for generating plasma (Patent Document 2). In the plasma processing apparatus using the radial line slot antenna, a slot antenna having a multiple number of slots is disposed on a dielectric window of a processing chamber. Microwave radiated through the multiple number of slots of the slot antenna is introduced into the processing chamber through the dielectric window made of a dielectric material. A processing gas is excited into plasma by the energy of the microwave.

In the microwave plasma generated by the radial line slot antenna, plasma having a relatively high electron temperature of several eV is diffused in a region (here, referred to as a plasma exciting region) directly under the dielectric window and the electron temperature of the plasma becomes to be as low as, e.g., about 1 eV to about 2 eV in a region (referred to as a plasma diffusing region) directly above a substrate and equal to or larger than about 100 mm below the dielectric window. That is, the distribution of the electron temperature of the plasma is defined as a function of a distance from the dielectric window.

In the plasma etching apparatus of the radial line slot antenna type, an etching gas is supplied into the low electron temperature region, and dissociation of the etching gas (i.e., a generation amount of etching species in the plasma) is controlled. As a result, an etching reaction (a surface chemical reaction of the substrate according to the etching species) is controlled. Accordingly, etching can be performed with high accuracy and damage on the substrate can be reduced greatly. By way of example, it is possible to fabricate a device accurately with designed dimensions in an etching process for forming a spacer, and, further, damage generation, such as a recess, on the substrate can be suppressed.

Patent Document 1: Japanese Patent Laid-open Publication No. 2008-047687

Patent Document 2: Japanese Patent Document Laid-open Publication No. 2010-118549

However, with the scale-up of a substrate to be processed, there has been a demand for improving uniformity of a substrate surface processing amount in the surface of the substrate. For example, in the etching apparatus using the radial line slot antenna described in Patent Document 2, it is difficult to uniformize an etching rate and an etching shape in the surface of the substrate. That is, it is required to perform the etching process uniformly on the surface of the substrate.

BRIEF SUMMARY OF THE INVENTION

In view of the foregoing problem, illustrative embodiments provide an antenna, a dielectric window, a plasma processing apparatus and a plasma processing method capable of improving uniformity of a substrate surface processing amount in the surface of the substrate.

In accordance with one aspect of an illustrative embodiment, there is provided an antenna including a dielectric window; and a slot plate, provided on one side of the dielectric window, having a multiple number of slots. The dielectric window may include a flat surface surrounded by a ring-shaped first recess; and a multiple number of second recesses formed on the flat surface so as to surround a center of the flat surface. Here, the flat surface may be formed on the other side of the dielectric window. When viewed from a thickness direction of the slot plate, a center of each second recess may be located within each slot of the slot plate.

By using this antenna, plasma having high uniformity in the surface of the substrate can be generated. Thus, in a plasma processing apparatus using this antenna, uniformity of a substrate surface processing amount in the surface of the substrate can be improved.

In accordance with the antenna of the illustrative embodiment, the slot plate may include a first slot group located at a first distance from a center of the slot plate; a second slot group located at a second distance from the center of the slot plate; a third slot group located at a third distance from the center of the slot plate; and a fourth slot group located at a fourth distance from the center of the slot plate. Here, the first distance, the second distance, the third distance and the fourth distance may satisfy a relationship of the first distance<the second distance<the third distance<the fourth distance. Further, angles between a straight line extended from the center of the slot plate toward a target slot in a diametrical direction and a lengthwise direction of the target slot in the first to the fourth slot groups may be identical to each other. Furthermore, a slot of the first slot group and a slot of the second slot group lying on a straight line extended from the center of the slot plate in the diametrical direction may be elongated in different directions. Moreover, a slot of the third slot group and a slot of the fourth slot group lying on a straight line extended from the center of the slot plate in the diametrical direction may be elongated in different directions. The number of slots of the first slot group and the number of slots of the second slot group may be identical to each other (N1) and the number of slots of the third slot group and the number of slots of the fourth slot group may be identical to each other (N2). Here, N2 may be an integer multiple of N1.

N2 is the integer multiple of N1. With this configuration, plasma having high symmetric property in the surface of the substrate can be generated.

In accordance with the antenna of the illustrative embodiment, each of the second recesses may have a circular plate shape.

When the plane has a circular plate shape, the shape of the recess from the center is uniform. Thus, stable plasma can be generated.

In accordance with another aspect of the illustrative embodiment, there is provided a plasma processing apparatus. The plasma processing apparatus may include the aforementioned antenna; a processing chamber for accommodating the antenna therein; a table, provided within the processing chamber so as to face the other side of the dielectric window, for mounting a processing target substrate thereon; and a microwave inlet path that connects a microwave generator with the slot plate.

In the plasma processing apparatus using the aforementioned antenna, plasma having high uniformity in the surface of the substrate can be generated. Accordingly, uniformity of a substrate surface processing amount in the surface of the substrate can be improved.

In accordance with the plasma processing apparatus of the illustrative embodiment, the plasma processing apparatus may further include a common gas line connected to a common gas source; a flow splitter provided on the common gas line, and configured to split the common gas line into a first split common gas line and a second split common gas line and adjust a flow rate ratio between gases flowing in the first split common gas line and the second split common gas line; a central inlet unit, connected to the first split common gas line, having a central inlet opening positioned above a central portion of the processing target substrate mounted on the table; a peripheral inlet unit connected to the second split common gas line, arranged along the circumferential direction of a space above the substrate and positioned under the dielectric window; and an additive gas line that connects an additive gas source with at least one of the first split common gas line and the second split common gas line.

By controlling the flow rate of the gas in each gas line, the uniformity of the substrate surface processing amount in the surface of the substrate can be improved.

In accordance with still another aspect of the illustrative embodiment, there is provided a plasma processing method for processing a substrate on the table by using the aforementioned plasma processing apparatus. Here, the common gas source may include a rare gas, and the additive gas source includes $C_5F_8$. Further, the plasma processing method may include generating plasma on the other side of the dielectric window by supplying microwave to the slot plate from the microwave generator through the microwave inlet path; supplying the rare gas from the common gas source to the central inlet unit via the first split common gas line; and supplying the $C_5F_8$ gas from the additive gas source to the peripheral inlet unit via the second split common gas line.

In accordance with this plasma processing method, uniformity of the substrate surface processing amount in the surface of the substrate can be improved.

In accordance with still another aspect of the illustrative embodiment, there is provided a dielectric window including a flat surface surrounded by a ring-shaped first recess; and a multiple number of second recesses formed on the flat surface so as to surround a center of the flat surface. Here, the flat surface being formed on one side of the dielectric window. Further, a slot plate having a multiple number of slots is provided on the other side of the dielectric window. When viewed from a thickness direction of the slot plate, a center of each second recess is located within each slot of the slot plate. The slot plate may include a first slot group located at a first distance from a center of the slot plate; a second slot group located at a second distance from the center of the slot plate; a third slot group located at a third distance from the center of the slot plate; and a fourth slot group located at a fourth distance from the center of the slot plate. Further, the first distance, the second distance, the third distance and the fourth distance may satisfy a relationship of the first distance<the second distance<the third distance<the fourth distance. Furthermore, angles between a straight line extended from the center of the slot plate toward a target slot in a diametrical direction and a lengthwise direction of the target slot in the first to the fourth slot groups may be identical to each other. A slot of the first slot group and a slot of the second slot group lying on a straight line extended from the center of the slot plate in the diametrical direction may be elongated in different directions. A slot of the third slot group and a slot of the fourth slot group lying on a straight line extended from the center of the slot plate in the diametrical direction may be elongated in different directions. The number of slots of the first slot group and the number of slots of the second slot group may be identical to each other, and the number of slots of the third slot group and the number of slots of the fourth slot group may be identical to each other.

The above-described dielectric window can be used in combination with the above-described slot plate.

In accordance with the illustrative embodiment, uniformity of the substrate surface processing amount in the surface of the substrate can be improved.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
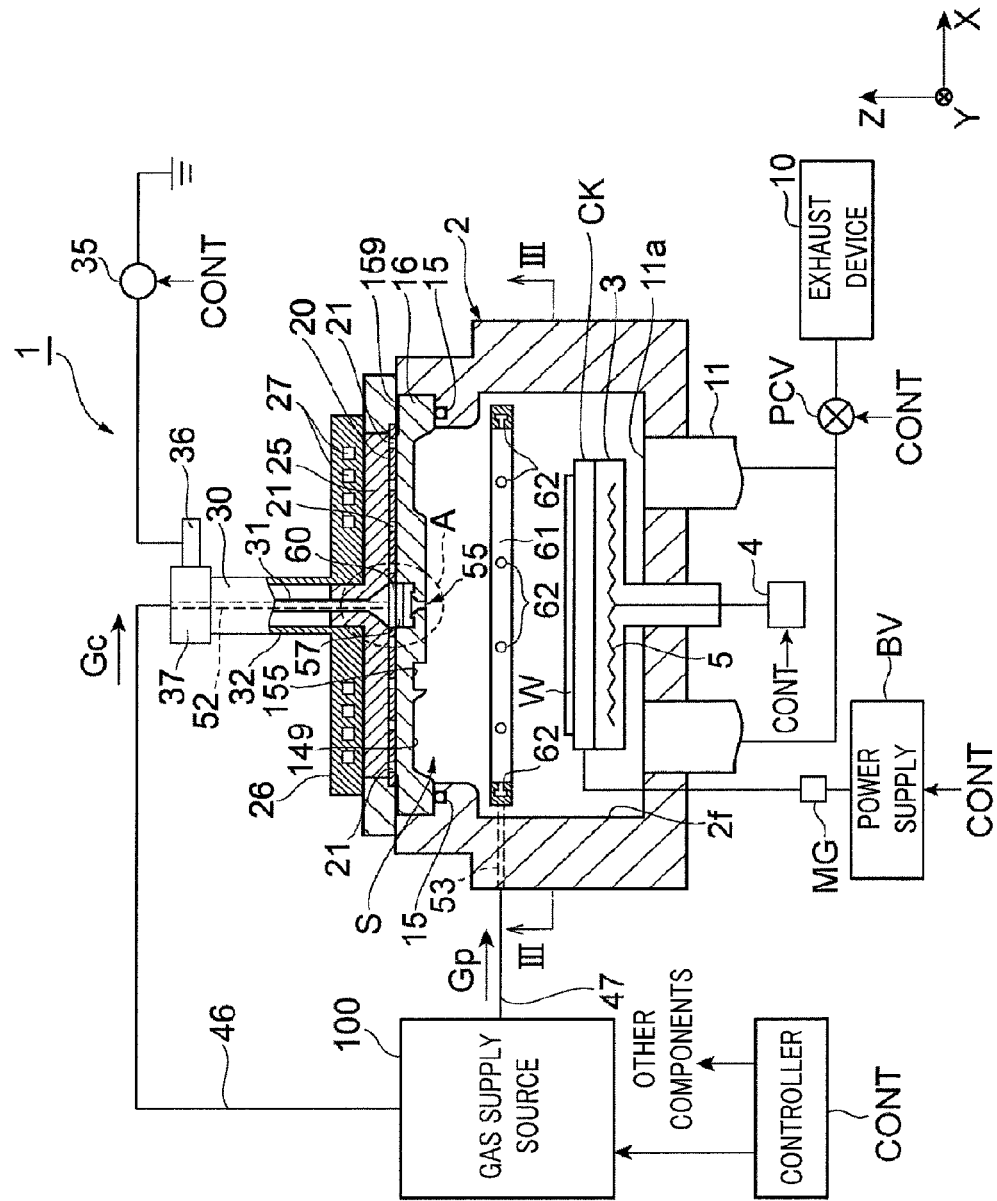
FIG. 1 is a longitudinal cross sectional view of a plasma processing apparatus in accordance with an illustrative embodiment.

Hereinafter, illustrative embodiments will be described in detail with reference to the accompanying drawings. Through the specification and the drawings, parts having substantially the same functions and configurations will be assigned same reference numerals.

FIG. 1 is a longitudinal cross sectional view of a plasma processing apparatus in accordance with an illustrative embodiment.

The plasma processing apparatus 1 includes a cylindrical processing chamber 2. A ceiling of the processing chamber 2 is covered by a dielectric window (ceiling plate) 16 made of a dielectric material. The processing chamber 2 is made of, but not limited to, aluminum and is electrically grounded. An inner wall surface of the processing chamber 2 is coated with an insulating protective film 2f such as alumina.

A table 3 for mounting thereon a semiconductor wafer W (hereinafter, simply referred to as a "wafer") as a substrate is provided at the center of the bottom of the processing chamber 2. The wafer W is held on a top surface of the table 3. The table 3 is made of, but not limited to, a ceramic material such as alumina or alumina nitride. A heater 5 is embedded in the table 3 so as to heat the wafer W to a preset temperature. The heater 5 is connected to a heater power supply 4 via a wiring accommodated in a supporting column.

An electrostatic chuck CK for electrostatically attracting and holding the wafer W mounted on the table 3 is provided on the top surface of the table 3. A bias power supply BV configured to apply a DC power or a high frequency power is connected to the electrostatic chuck CK via a matching unit MG.

An exhaust pipe 11 for exhausting a processing gas through an exhaust port 11a, which is located below the surface of the wafer W mounted on the table 3, is provided at a bottom portion of the processing chamber 2. The exhaust pipe 11 is connected with an exhaust device 10 such as a vacuum pump via a pressure control valve PCV. The exhaust device 10 communicates with the inside of the processing chamber 2 via the pressure control valve PCV. By using the pressure control valve PCV and the exhaust device 10, an inner pressure of the processing chamber 2 is controlled at a preset pressure.

A dielectric window 16 is provided at a ceiling portion of the processing chamber 2 via a seal 15 such as an O-ring for airtightly sealing the processing chamber 2. The dielectric window 16 is made of, but not limited to, a dielectric material such as quartz, alumina ($Al_2O_3$) or aluminum nitride (AlN) and configured to transmit microwave.

A circular plate-shaped slot plate 20 is provided on a top surface of the dielectric window 16. The slot plate 20 is made of copper plated or coated with a conductive material such as Ag or Au. The slot plate 20 has a multiple number of, e.g., T-shaped or L-shaped slots 21 that are concentrically arranged.

A dielectric plate 25 for compressing a wavelength of microwave is provided on a top surface of the slot plate 20. The dielectric plate 25 is made of a dielectric material such as, but not limited to, quartz ($SiO_2$), alumina ($Al_2O_3$) or aluminum nitride (AlN). The dielectric plate 25 is covered with a conductive cover 26. A circular ring-shaped heat transfer medium path 27 is formed in the cover 26. The cover 26 and the dielectric plate 25 are controlled to have a certain temperatures by a heat transfer medium flowing through the heat transfer medium path 27. By way of example, for microwave of, e.g., about 2.45 GHz, the wavelength of the microwave in a vacuum is about 12 cm and the wavelength of the microwave within the dielectric window 16 made of alumina is about 3 cm to about 4 cm.

A coaxial waveguide 30 for propagating the microwave is connected to the center of the cover 26. The coaxial waveguide 30 includes an internal conductor 31 and an external conductor 32. The internal conductor 31 is connected to the center of the slot plate 20 through the center of the dielectric plate 25.

The coaxial waveguide 30 is connected with a microwave generator 35 via a mode converter 37 and a rectangular waveguide 36. Besides the microwave of about 2.45 GHz, microwave of about 860 MHz, about 915 MHz or about 8.35 GHz may be used.

Microwave generated by the microwave generator 35 is propagated into the rectangular waveguide 36, the mode converter 37, the coaxial waveguide 30 and the dielectric plate 25, which form a microwave inlet path. The microwave propagated into the dielectric plate 25 is supplied into the processing chamber 2 through the multiple number of slots 21 of the slot plate 20 and the dielectric window 16. An electric field is formed under the dielectric window 16 by the microwave, and a processing gas within the processing chamber 2 is excited into plasma.

A lower end of the internal conductor 31 connected to the slot plate 20 has a cone shape, of which a vicinity of apex is horizontally cut. Accordingly, the microwave can be efficiently propagated from the coaxial waveguide 30 to the dielectric plate 25 and the slot plate 20 without a loss.

In microwave plasma generated by the radial line slot antenna, plasma having a relatively high electron temperature is diffused in a region (here, referred to as a plasma exciting region) directly under the dielectric window 16 and the plasma becomes to have an electron temperature as low as, e.g., about 1 eV to about 2 eV in a region (referred to as a plasma diffusing region) directly above the wafer W. That is, this microwave plasma generated in the radial line slot antenna is different from plasma generated in the parallel plate or the like. The distribution of the electron temperature of the plasma is defined as a function of a distance from the dielectric window 16. To be more specific, the electron temperature of, e.g., several eV to about 10 eV directly under the dielectric window 16 decreases to, e.g., about 1 eV to about 2 eV directly above the wafer W. Since the wafer W is processed in the region (plasma diffusing region) where the electron temperature of the plasma becomes low, a great damage such as a recess may not be caused on the wafer W. If a processing gas is supplied into the region (plasma exciting region) where the electron temperature of the plasma is high, the processing gas is readily excited and dissociated. Meanwhile, if the processing gas is supplied into the region (plasma diffusing region) where the electron temperature of the plasma becomes low, the degree of dissociation is reduced as compared to the case where the processing gas is supplied to the vicinity of the plasma exciting region.

A central inlet unit 55 for introducing the processing gas to a central portion of the wafer W is provided at the center of the dielectric window 16 at the ceiling of the processing chamber 2. A supply path 52 for supplying the processing gas is formed in the internal conductor 31 of the coaxial waveguide 30. The central inlet unit 55 is connected to the supply path 52.

The central inlet unit 55 includes a cylindrical block 57 inserted into a cylindrical space 143 (see FIG. 8); a gas storage portion 60 formed between a bottom surface of the internal conductor 31 of the coaxial waveguide 30 and a top surface of the block 57 with a certain distance therebetween; and a taper-shaped space 143a (see FIG. 8) having an opening 59, through which a gas is discharged, at a leading end thereof. The space 143a continuously includes cylindrical spaces. The block 57 is made of a conductive material such as, but not limited to, aluminum and is electrically grounded. A multiple number of central inlet openings 58 (see FIG. 3) are formed through the block 57 in a vertical direction.

Figure 3:
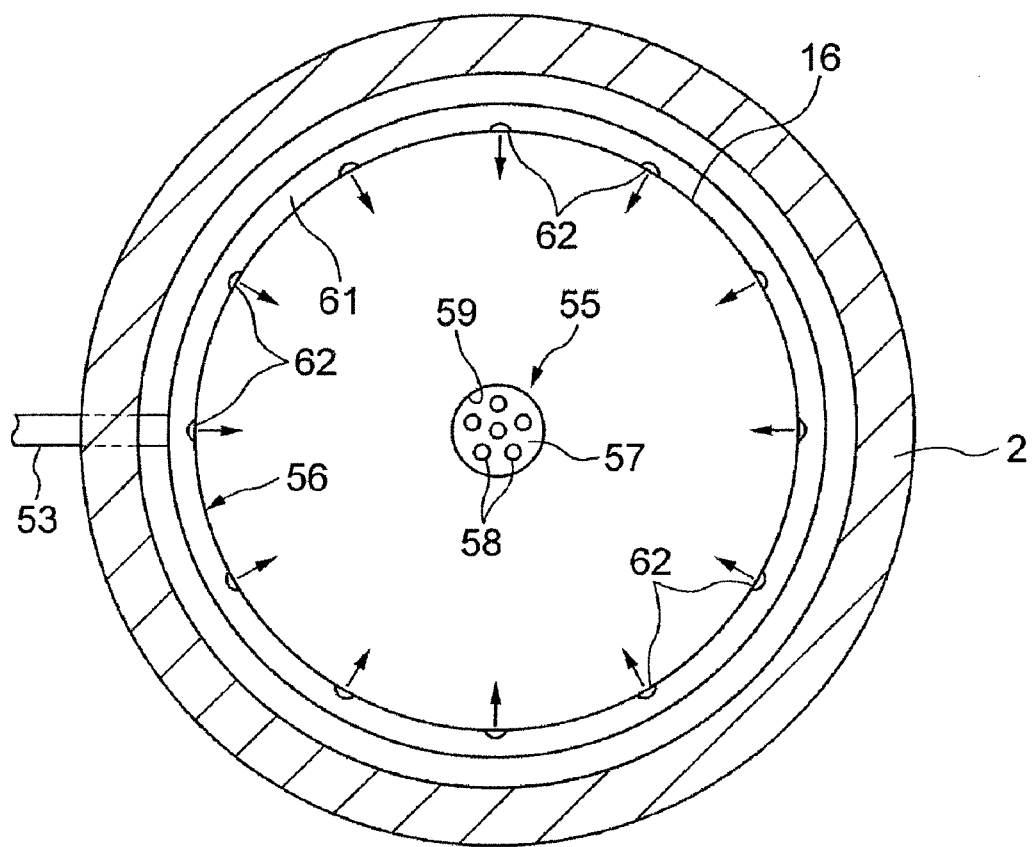
FIG. 3 is a cross sectional view taken along a line III-III of FIG. 1.
Figure 3:
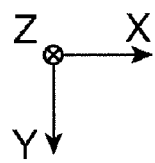

In FIG. 3, to readily observe the central inlet openings 58, the opening 59 for gas discharge is shown to be larger than an actual size thereof. Further, the shape of the space 143a may not be limited to the tapered shape but may be a simple cylindrical shape. In such a case, the size of the opening 59 for gas discharge may be enlarged as in FIG. 3. A plane shape of the central inlet openings 58 have circular or elongated hole shapes in consideration of required conductance or the like. The block 57 made of aluminum is coated with anodically oxidized alumina ($Al_2O_3$), Yttria ($Y_2O_3$), or the like.

The processing gas supplied into the gas storage portion 60 from the supply path 52 formed in the internal conductor 31 is discharged downward toward the central portion of the wafer W from the multiple number of central inlet openings 58 of the block 57 after diffused within the gas storage portion 60.

A ring-shaped peripheral inlet unit 61 for supplying a processing gas to a peripheral portion of the wafer W is provided within the processing chamber 2 so as to surround the periphery of a space above the wafer W. The peripheral inlet unit 61 is positioned below the central inlet openings 58 at the ceiling portion and above the wafer W mounted on the table 3. The peripheral inlet unit 61 is formed of a ring-shaped hollow pipe, and a multiple number of peripheral inlet openings 62 are formed on an inner peripheral surface of the peripheral inlet unit 61 at a regular interval. The peripheral inlet openings 62 discharge the processing gas toward the center of the peripheral inlet unit 61. The peripheral inlet unit 61 may be made of, but not limited to, quartz. A supply path 53 made of stainless steel is formed through the sidewall of the processing chamber 2. The supply path 53 is connected to the peripheral inlet unit 61. The processing gas supplied into the peripheral inlet unit 61 from the supply path 53 is discharged toward an inner side of the peripheral inlet unit 61 from the peripheral inlet openings 62 after diffused in a space within the peripheral inlet unit 61. The processing gas discharged from the peripheral inlet openings 62 is supplied to a space above the peripheral portion of the wafer W. Instead of providing the ring-shaped peripheral inlet unit 61, a multiple number of peripheral inlet openings 62 may be formed in the inner wall surface of the processing chamber 2.

Figure 2:
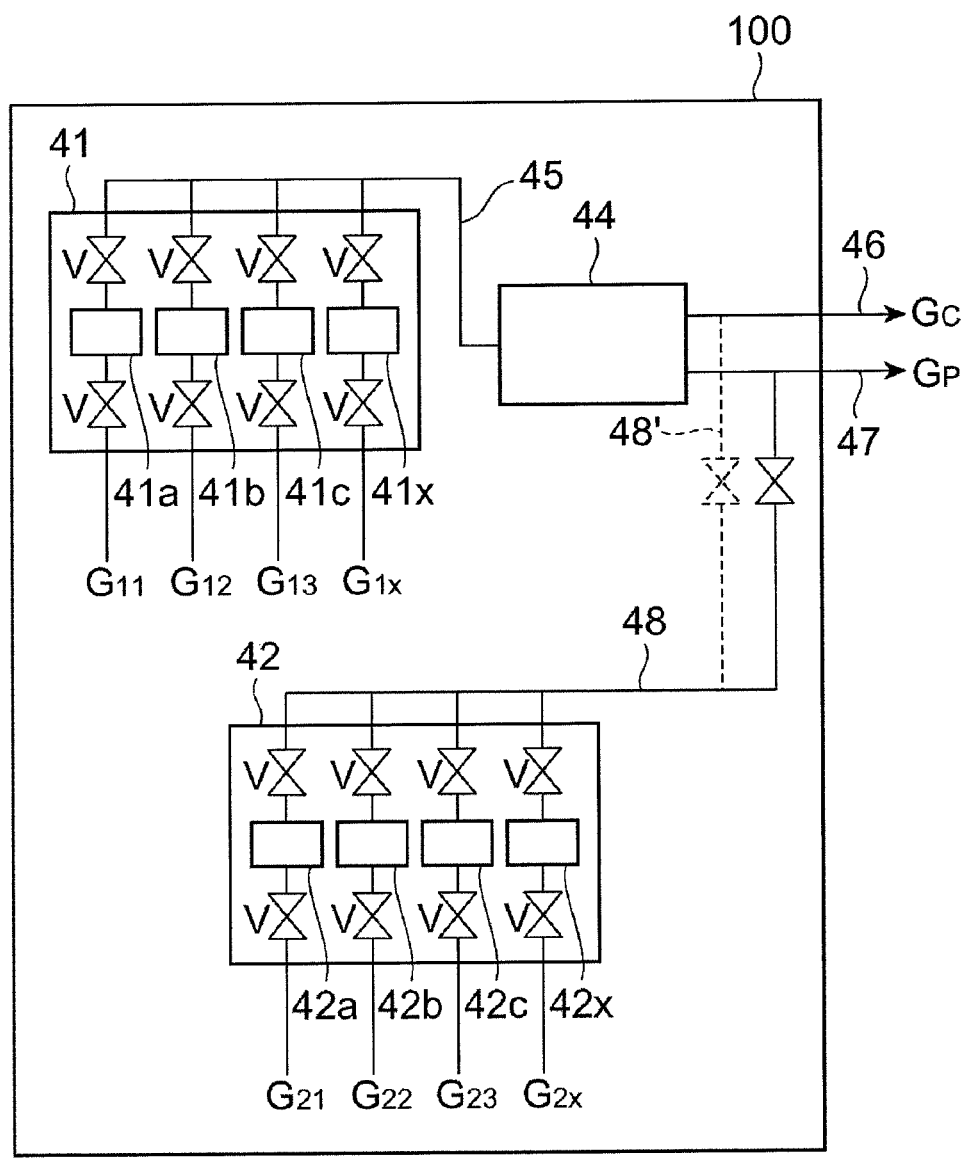
FIG. 2 is a block diagram illustrating a detailed configuration of a gas supply source.

FIG. 2 is a block diagram illustrating a detailed configuration of a gas supply source.

A gas supply source 100 for supplying a processing gas into the processing chamber 2 includes a common gas source 41 and an additive gas source 42. The common gas source 41 and the additive gas source 42 are configured to supply processing gases for a plasma etching process, a plasma CVD process, or the like.

The common gas source 41 is connected to a common gas line 45, and the common gas line 45 is connected to a flow splitter 44. The flow splitter 44 is provided at the common gas line 45 and splits the common gas line 45 into a first split common gas line 46 and a second split common gas line 47. The flow splitter 44 is capable of adjusting a ratio between flow rates of gases flowing in the first and second split common gas lines 46 and 47. Here, the first split common gas line 46 is connected to the central inlet unit 55 (see FIG. 1) via the supply path 52 and supplies a central supply gas Gc to the central inlet unit 55. Further, the second split common gas line 47 is connected to the peripheral inlet unit 61 (see FIG. 1) via the supply path 53 and supplies a peripheral supply gas Gp to the peripheral inlet unit 61.

The additive gas source 42 is connected to the second split common gas line 47 via an additive gas line 48. Alternatively, the additive gas source 42 may be connected to the first split common gas line 46 via an additive gas line 48'. Further, the additive gas source 42 may be connected to both of the first and second split common gas lines 47 and 46 via the additive gas lines 48 and 48', respectively.

The common gas source 41 includes multiple kinds of gases $G_{11}$, $G_{12}$, $G_{13}$, $G_{1x}$, and there are provided flow rate control valves 41a, 41b, 41c and 41x for controlling flow rates of these gases, respectively. Valves V for opening and closing line passages are provided upstream and downstream sides of lines connected to the flow rate control valves 41a, 41b, 41c and 41x. The flow rate control valves 41a, 41b, 41c and 41x are connected to the common gas line 45 via the respective valves V.

The additive gas source 42 includes multiple kinds of gases ($G_{21}$, $G_{22}$, $G_{23}$, $G_{2x}$), and there are provided flow rate control valve 42a, 42b, 42c and 42x for controlling flow rates of these gases, respectively. Valves V for opening and closing line passages are provided upstream and downstream sides of lines connected to the flow rate control valves 42a, 42b, 42c and 42x. The flow rate control valves 42a, 42b, 42c and 42x are connected to the additive gas line 48 via the respective valves V.

A controller CONT shown in FIG. 1 is configured to control the various valves V and the flow rate control valves 41a, 41b, 41c, 41x, 42a, 42b, 42c and 42x in the gas supply source. Ultimately, the controller CONT is configured to control a partial pressure ratio of a certain gas included in the gases Gc and Gp flowing in the first and second split common gas lines 46 and 47, respectively. The controller CONT is configured to control a flow rate of each gas and sets a flow rate and a partial pressure for each common gas supplied to the flow splitter 44. In this apparatus, a partial pressure for each central supply gas Gc supplied to the central portion of the wafer W and each peripheral supply gas Gp supplied to the periphery of the wafer W can be varied or the gas itself can be varied. Thus, plasma process characteristics can be varied in wide variety.

By way of non-limiting example, a rare gas (e.g., Ar gas) may be used as the gas $G_{1x}$ for use in the common gas source 41. Other additive gases may also be used.

When etching a silicon-based film such as polysilicon, an Ar gas, a HBr gas (or a $Cl_2$ gas) and an $O_2$ gas are used as the additive gases $G_{21}$, $G_{22}$, $G_{23}$. When etching an oxide film such as $SiO_2$, an Ar gas, a CHF-based gas, a CF-based gas, and an $O_2$ gas are used as the additive gases $G_{21}$, $G_{22}$, $G_{23}$, $G_{2x}$. When etching a nitride film such as SiN, an Ar gas, a CF-based gas, a CHF-based gas and an $O_2$ gas are used as the additive gases $G_{21}$, $G_{22}$, $G_{23}$, $G_{2x}$.

The CHF-based gas may be, but not limited to, $CH_3(CH_2)_3CH_2F$, $CH_3(CH_2)_4CH_2F$, $CH_3(CH_2)_7CH_2F$, $CHCH_3F_2$, $CHF_3$, $CH_3F$ or $CH_2F_2$.

The CF-based gas may be, but not limited to, $C(CF_3)_4$, $C(C_2F_5)_4$, $C_4F_8$, $C_2F_2$, or $C_5F_8$. In order to obtain dissociated species suitable for etching, $C_5F_8$ is desirable.

In this apparatus, the common gas source 41 and the additive gas source 42 may supply same kinds of gases or different kinds of gases.

In order to suppress dissociation of an etching gas, a plasma excitation gas may be supplied from the common gas source 41 and an etching gas may be supplied from the additive gas source 42. By way of example, when etching a silicon-based film, only the Ar gas may be supplied from the common gas source 41 as the plasma excitation gas, and only the HBr gas and the $O_2$ gas may be supplied from the additive gas source 42 as etching gases.

The common gas source 41 also supplies a cleaning gas such as $O_2$ or $SF_6$ and other common gases.

Here, in order to generate plasma uniformly and process on the surface of the wafer W uniformly, there is provided a technique of adjusting a gas amount introduced from the central inlet unit 55 (see FIG. 3) and the peripheral inlet unit 61 (see FIG. 1) by adjusting a split ratio of a common gas through the flow splitter 44. This technique is referred to as a RDC (Radical Distribution Control). The RDC is carried out by controlling a ratio between a gas introduction amount from the central inlet unit 55 and a gas introduction amount from the peripheral inlet unit 61. In a general RDC, gases introduced from the central inlet unit 55 and the peripheral inlet unit 61 are the same. An optimum RDC value is determined experimentally according to each kind of a film to be etched and various conditions. Meanwhile, a technique of supplying an additive gas to the central inlet unit 55 or the peripheral inlet unit 61 in addition to the RDC is referred to as an ARDC (Advanced Radical Distribution Control).

In an etching process, by-products (etched residues or deposits) are generated as the etching progresses. In order to improve a gas flow within the processing chamber 2 and easily discharge the by-products toward the outside of the processing chamber 2, it is considered to introduce the gases from the central inlet unit 55 and from the peripheral inlet unit 61 alternately. This is possible by varying a RDC value as time passes. By way of example, by adjusting a gas current through repetitively performing a process for introducing a great amount of gas to the central portion of the wafer W and a process for introducing a great amount of gas to the peripheral portion of the wafer W at a certain cycle, the by-products are removed from the processing chamber 2. Accordingly, it is possible to obtain a uniform etching rate.

Figure 4:
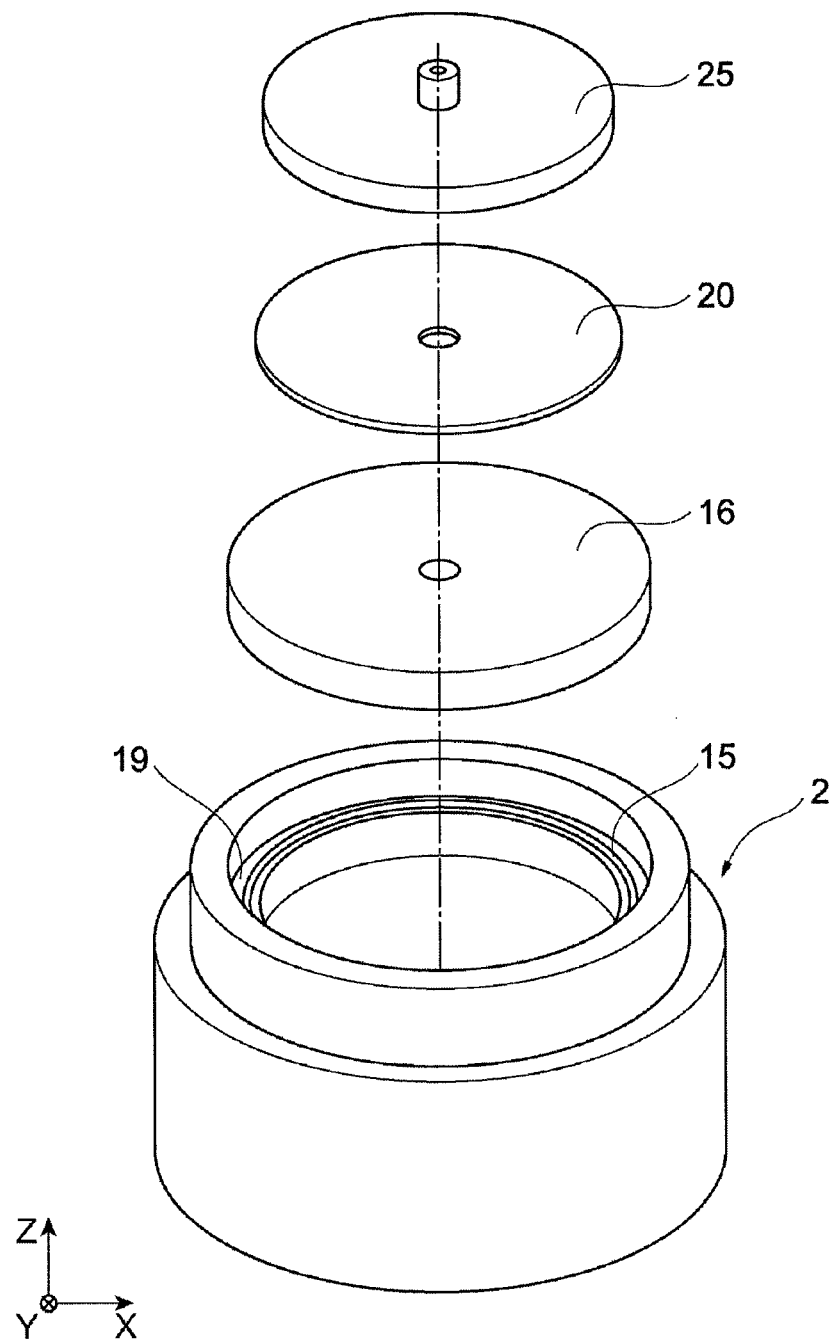
FIG. 4 is an exploded perspective view illustrating a slot plate and the vicinity thereof.

FIG. 4 is an exploded perspective view showing a structure in the vicinity of the slot plate.

A bottom surface of the dielectric window 16 (i.e., a surface on which a recess is formed) is provided to the plasma processing apparatus 1 by being mounted on a surface of a circular ring-shaped member 19 serving as a part of the sidewall of the processing chamber 2. The slot plate 20 is provided on the top surface of the dielectric window 16, and the dielectric plate 25 is provided on the slot plate 20. The dielectric window 16, the slot plate 20 and the dielectric plate 25 have circular plate shapes, and their centers have a same axis (Z axis).

Further, the slot plate 20 has various patterns of slots. In FIG. 4, for clear and simple illustration, the slots are not shown on the slot plate 20. Instead, the slots are shown in FIG. 5.

Figure 5:
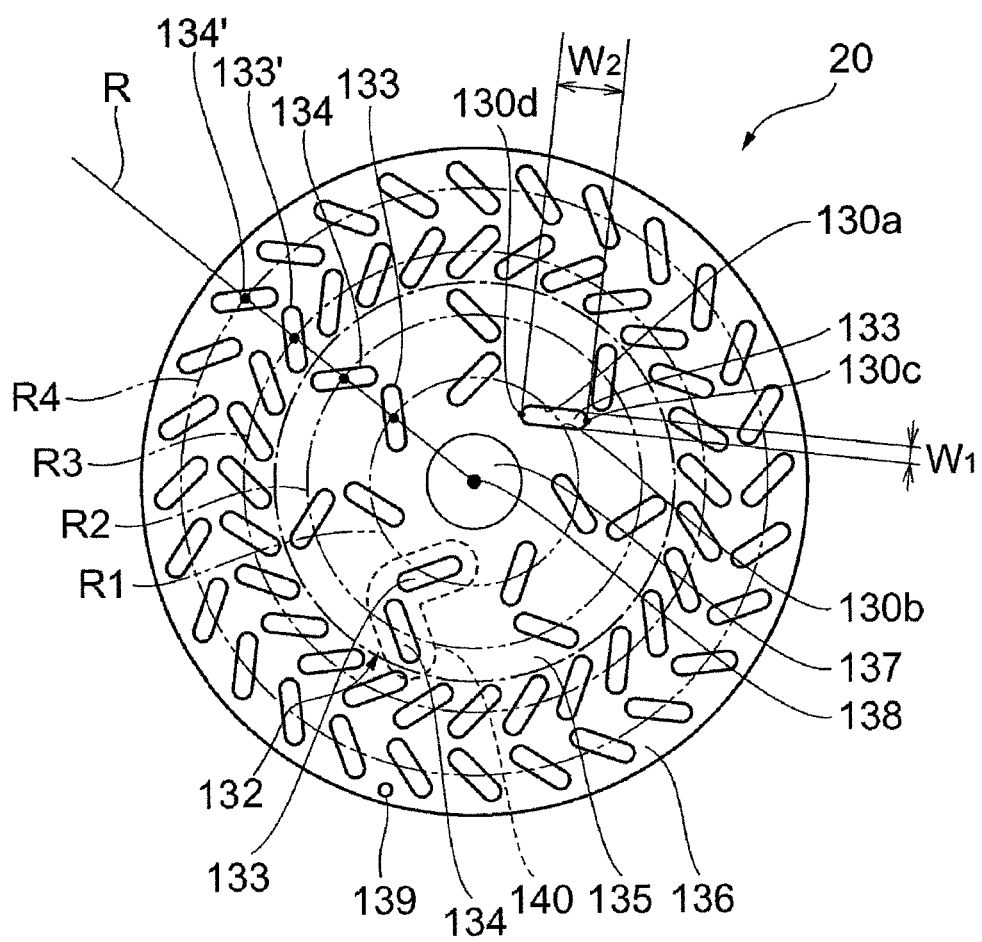
FIG. 5 is a plane view of the slot plate.

FIG. 5 is a plane view of the slot plate 20.

The slot plate 20 has a thin circular plate shape. Two opposite surfaces of the slot plate 20 in a thickness direction thereof are both flat. A multiple number of slots 132 are formed through the slot plate 20 in the thickness direction thereof. Each of the slots 132 includes a first slot 133 and a second slot 134, and the first and second slots 133 and 134 make a pair. Here, the first slot 133 is elongated in one direction and the second slot 134 is elongated in a direction orthogonal to the elongated direction of the first slot 132. To elaborate, every two adjacent slots 133 and 134 make a pair and are arranged in a substantially L shape with a cut-off center. That is, the slot plate 20 has slot pairs 140, each having the first slot 133 elongated in the one direction and the second slot 134 elongated in the other direction orthogonal to the one direction of the first slot 133. A portion marked by a dashed line in FIG. 5 indicates an example slot pair 140.

In accordance with the present illustrative embodiment an opening width of the first slot 133, i.e., length $W_1$ between one wall portion 130*a* extended in a lengthwise direction of the first slot 133 and the other wall portion 130*b* extended in the lengthwise direction of the first slot 133 is set to be, e.g., about 12 mm. Meanwhile, a length of the first slot 133, i.e., a length $W_2$ between one end 130*c* in the lengthwise direction of the first slot 133 and the other end 130*d* in the lengthwise direction of the first slot 133 is set to be, e.g., about 35 mm. The widths $W_1$ and $W_2$ may be varied within a range of about ±10%, desirably. However, this range may be varied. As for the first slot 133, a ratio ($W_1/W_2$) of the short side length to the long side length is set to be, e.g., about $12/35$=about 0.34, i.e., about $\frac{1}{3}$. The second slot 134 has the same opening shape as that of the first slot 133. That is, the second slot 134 is obtained by rotating the first slot 133 about 90 degrees. Further, when a long hole such as a slot is formed, the length ratio ($W_1/W_2$) is set to be smaller than a value of 1.

The slot pairs 140 may be divided into an inner slot pair group 135 arranged in an inner region of the slot plate and an outer slot pair group 136 arranged in an outer region of the slot plate. The inner slot pair group 135 includes seven slot pairs 140 positioned inside an imaginary circle indicted by a dashed-dotted line in FIG. 5. The outer slot pair group 136 includes twenty eight slot pairs 140 positioned outside the imaginary circle indicated by the dashed-dotted line in FIG. 5. As for the inner slot pair group 135, the seven slot pairs 140 are arranged at a regular interval in a circumferential direction of the slot plate.

With this configuration, one slot of each slot pair 140, which is arranged in the inner slot pair group 135, can be arranged at a position where a second recess in the form of circular dimples are formed, and its position can be adjusted. As for the outer slot pair group 136, the twenty eight slot pairs 140 are arranged at a regular interval in the circumferential direction of the slot plate. A through hole 137 is also formed at the center of the slot plate 20 in a diametrical direction.

Further, a reference hole 139 is formed through the slot plate in the thickness direction thereof in a peripheral region of the outer slot pair group 136. The reference hole 139 allows the slot plate 20 to be easily positioned in the circumferential direction. That is, with the reference hole 139 as a mark, the position of the slot plate 20 in the circumferential direction with respect to the processing chamber 2 and the dielectric window 16 is determined. The slot plate 20 has rotation symmetric property about a center position 138 of the slot plate in the diametrical direction, except for the reference hole 139.

Each slot pair of the outer slot pair group 136 includes slots 133' and 134'. Positions and arrangement of these slots 133' and 134' are the same as those of the slots 133 and 134 excepting that the slots 133' and 134' are located in the outer region.

The structure of the slot plate 20 will be elaborated. The slot plate 20 includes a first group of slots 133 located at a first distance R1 (indicated by a circle R1) from the center position 138 of the slot plate 20; a second group of slots 134 located at a second distance R2 (indicated by a circle R2) from the center position 138; a third group of slots 133' located at a third distance R3 (indicated by a circle R3) from the center position 138; and a fourth group of slots 134' located at a fourth distance R4 (indicated by a circle R4) from the center position 138.

Here, the distances R1 to R4 satisfy a relationship of the first distance R1<the second distance R2<the third distance R3<the fourth distance R3. An angle between a straight line (line R) extended from the center position 138 of the slot plate toward a target slot (one of the slots 133, 134, 133' and 134') in a diametrical direction and the lengthwise direction of each slot is same between the first to the fourth group of slots 133, 134, 133' and 134'.

The slot 133 of the first group and the slot 134 of the second group lying on the same straight line (line R) extended from the center position 138 of the slot plate 20 in the diametrical direction are elongated in different directions (orthogonally in the present illustrative embodiment). A slot 133' of the third group and a slot 134' of the fourth group lying on the same straight line (line R) extended from the center position 138 of the slot plate 20 in the diametrical direction are elongated in different directions (orthogonally in the present illustrative embodiment). The number of the slots 133 of the first group and the number of the slots 134 of the second group are same (N1), and the number of the slots 133' of the third group and the number of the slots 134' of the fourth group are same (N2).

Here, N2 is an integer multiple of N1. With this configuration, it is possible to generate plasma having high symmetric property in the surface of the wafer W.

Figure 6:
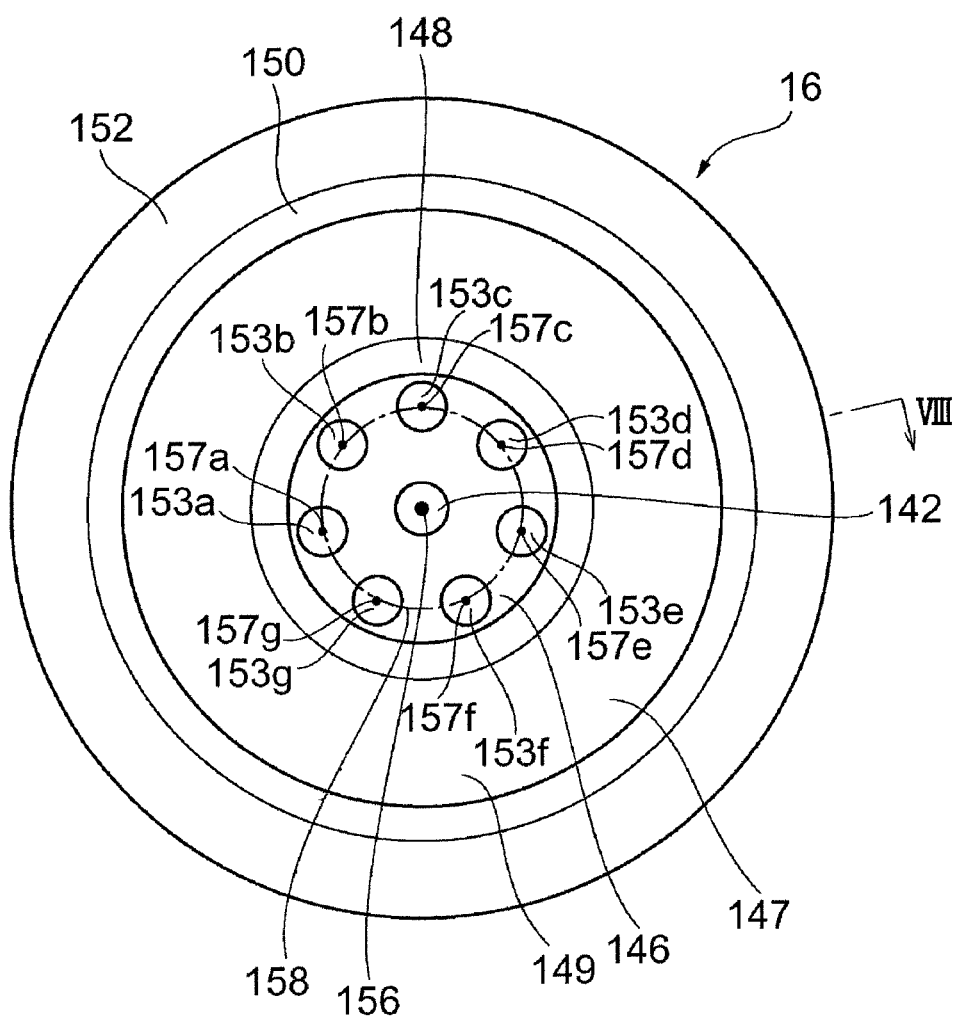
FIG. 6 is a plane view of a dielectric window.
Figure 8:
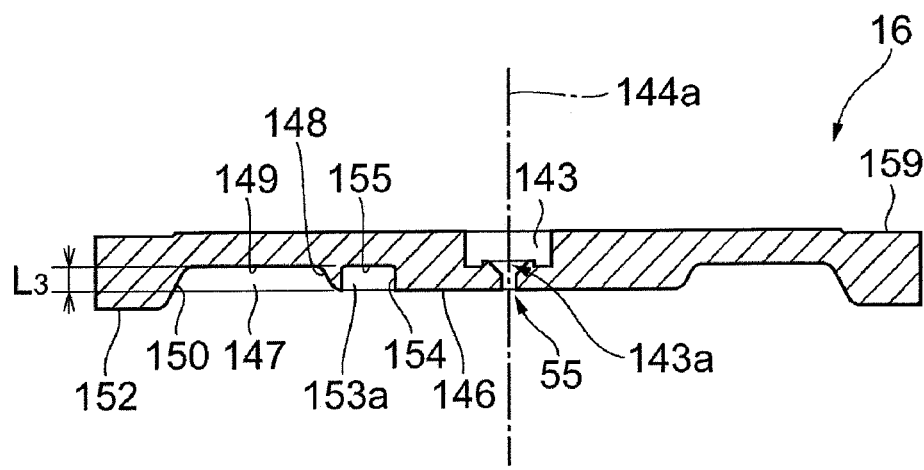
FIG. 8 is a cross sectional view of the dielectric window.

FIG. 6 is a plane view of the dielectric window 16, and FIG. 8 is a cross sectional view of the dielectric window 16.

The dielectric window 16 has a substantially circular plate shape and has a certain plate thickness. The dielectric window 16 is made of a dielectric material. By way of non-limiting example, the dielectric window 16 is made of quartz or alumina. The slot plate 20 is placed on a top surface 159 of the dielectric window 16.

A through hole 142 is formed at the center of the dielectric window 16 in a diametrical direction. The through hole 142 is formed through the dielectric window 16 in a plate thickens direction, i.e., in a vertical direction of the drawing. A lower region of the through hole 142 serves as a gas supply opening of the central inlet unit 55. An upper region of the through hole 142 serves as a recess 143 in which the block 57 of the central inlet unit 55 is accommodated. Further, a central axis 144a of the dielectric window 16 in its diametrical direction is shown by a dashed-dotted line in FIG. 8.

A ring-shaped first recess 147 is formed on the dielectric window 16 so as to be located outside a flat surface 146 in the diametrical direction. The flat surface 146 is positioned on the bottom side of the dielectric window 16 where plasma is generated when the dielectric window 16 is provided to the plasma processing apparatus. The first recess 147 is extended to a ring shape, and has a tapered shape inwardly in the plate thickness direction of the dielectric window 16. The flat surface 146 is formed on a central region of the dielectric window 16 in the diametrical direction. Second recesses 153a to 153g, each having a circular shape, are formed on the central flat surface 146 at a regular interval in the circumferential direction thereof. The ring-shaped first recess 147 includes an inner tapered surface 148 extended outward from a periphery region of the flat surface 146 in a tapered shape, i.e., inclined with respect to the flat surface 146; a flat bottom surface 149 straightly extended outward from the inner tapered surface 148 in parallel to the flat surface 146; and an outer tapered surface 150 extended outward from the bottom surface 149 in a tapered shape, i.e., inclined with respect to the bottom surface 149.

Angles for the tapered surfaces, e.g., an angle defined in a direction in which the inner tapered surface 148 is extended with respect to the bottom surface 149 and an angle defined in a direction in which the outer tapered surface 150 is extended with respect to the bottom surface 149 are set in a predetermined value. In the present illustrative embodiment, the angles are set to be same at any positions in the circumferential direction of the dielectric window 16. The inner tapered surface 148, the bottom surface 149 and the outer tapered surface 150 are extended as smooth curved surfaces, respectively. Further, on a outer region of the outer tapered surface 150, there is provided a peripheral flat surface 152 straightly extended outward in the diametrical direction, i.e., in parallel to the flat surface 146. The peripheral flat surface 152 serves as a supporting surface for the dielectric window 16.

That is, the dielectric window 16 is provided in the processing chamber 2 such that the peripheral flat surface 152 is mounted on an upper end surface of an inner region of the circular ring-shaped member 19 (see FIG. 4).

By providing the ring-shaped first recess 147, there is formed, on the outer region of the dielectric window 16 in the diametrical direction, a region where the thickness of the dielectric window 16 varies continually. Accordingly, there can be provided a resonance region having a thickness of dielectric window 16 suitable for various processing conditions for plasma generation. With this configuration, under various processing conditions, high stability of plasma can be obtained on the outer region in the diametrical direction.

Here, the second recesses 153 (153a to 153g), which are extended inwardly from the flat surface 146 in the plate thickness direction of the dielectric window, are formed on the inner region of the ring-shaped first recess 147 in the diametrical direction. Each second recess 153 has a circular plate shape. An inner sidewall surface of the second recess 153 is a cylindrical surface, and a bottom surface thereof is flat. Since a circle is a polygonal with infinite corners, the second recess 153 may have a polygonal plate shape with finite corners. It is considered that plasma is generated in the recess when microwave is introduced. Accordingly, when the recess has a circular plate shape, stable plasma can be generated because the shape of the recess from the center is uniform.

In accordance with the present illustrative embodiment, the total number of the second recesses 153 is seven, which is the same as the number of the inner slot pairs. The shapes of the seven recesses 153a, 153b, 153c, 153d, 153e, 153f and 153g are same. That is, the second recesses 153a to 153g are formed respectively the same in, e.g., their sizes, hole diameters and the way and degree in which they are extended. The seven second recesses 153a to 153g are arranged at a regular interval so as to have rotation symmetric property with respect to a center 156 of the dielectric window 16. When viewed from the plate thickness direction of the dielectric window 16, centers 157a, 157b, 157c, 157d, 157e, 157f and 157g of the circular hole-shaped seven second recesses 153a to 153g are positioned on a circle 158 centered about the center 156 of the dielectric window 16. That is, with this arrangement of the second recesses 153a to 153g, if the dielectric window 16 is rotated 51.42 degrees (=360 degrees/7) about the center 156 of the dielectric window 16, the same arrangement as before the dielectric window 16 is rotated is obtained. The circle 158 is marked by a dashed-dotted line in FIG. 6. The diameter of the circle 158 is, e.g., about 154 mm, and the diameter of each of the second recesses 153a to 153g is, e.g., about 30 mm.

The depth of each second recess 153 (153a to 153g), i.e., a distance between the flat surface 146 and the bottom surface 155 indicated by a length $L_3$ in FIG. 8 is set to have a certain value. In the present illustrative embodiment, it is set to be about 32 mm, for example. The diameter of each second recess 153 and the distance from the bottom surface of the recess 153 to the top surface of the dielectric window 16 is set to be about ¼ of a wavelength λg of the microwave introduced to the dielectric window 16. Further, in the present illustrative embodiment, the diameter of the dielectric window 16 is, e.g., about 460 mm. Furthermore, the diameter of the circle 158, the diameter of the recess 153 and the diameter of the dielectric window 16 can be varied within a range of ±10% of the above-specified values. However, conditions for operating the present apparatus are not limited thereto, and these conditions may be varied as long as plasma is confined in the recesses. If the diameter and the depth of the recess closely located to the center are increased, plasma density becomes higher at a center region than at a periphery region. Accordingly, by adjusting the diameter and the depth of the recess, balance in the plasma density between the center region and the periphery region can be adjusted.

By providing the second recesses 153a to 153g, an electric field of the microwave can be concentrated to the inside of the recesses. Accordingly, a mode locking can be performed firmly in the inner region of the dielectric window 16 in the diametrical direction. In such a case, even if processing conditions are varied in wide variety, a firmly mode-locked region can be formed in the inner region of the dielectric window 16 in the diametrical direction, so that stable and uniform plasma can be generated. As a result, uniformity of substrate surface processing amount in the surface of a substrate can be improved. Especially, since the second recesses 153a to 153g have rotation symmetric property, firm mode locking with high axial symmetric property can be realized in the inner region of the dielectric window 16 in the diametrical direction. Thus, generated plasma also has high axial symmetric property.

As described above, the dielectric window 16 having the above-described configuration has a wide range of process margin and plasma generated by using this dielectric window 16 has high axial symmetric property.

Figure 7:
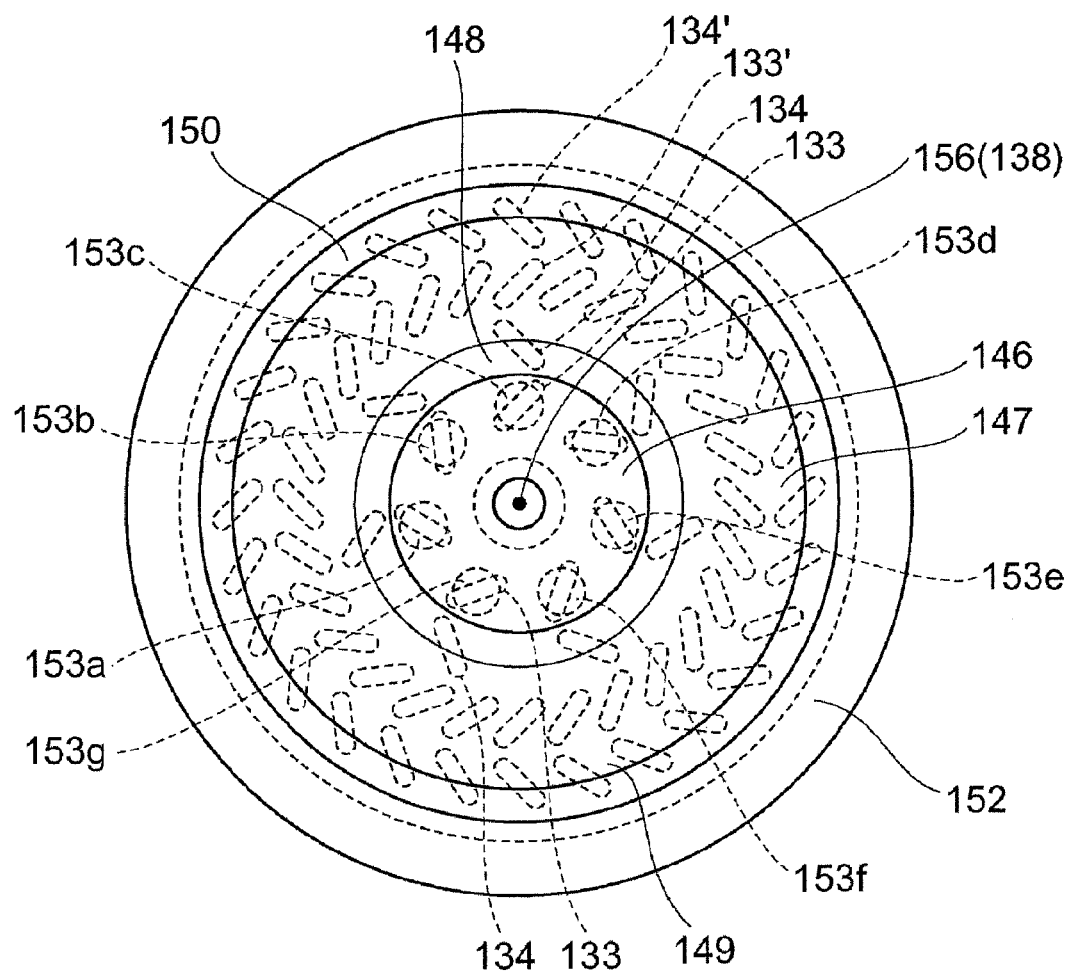
FIG. 7 is a plane view of an antenna including the slot plate and the dielectric window.

FIG. 7 is a plane view of an antenna including a slot plate and a dielectric window. FIG. 7 shows a radial line slot antenna as seen from below along a Z-axis of FIG. 1.

In the plane view, a portion of the outer tapered surface 150 is overlapped with a portion of the slot 134' of the fourth slot group (the fourth slot group from the center). Further, the ring-shaped flat bottom surface 149 is overlapped with the slot 133' of the third slot group (the third slot group from the center).

In the plane view, the inner tapered surface 148 is overlapped with the slot 134 of the second slot group (the second slot group from the center). Further, the slot 133 of the innermost first slot group is positioned on the flat surface 146. Furthermore, a center position of the second recess 153 is overlapped with a center position of the slot 133.

Figure 14:
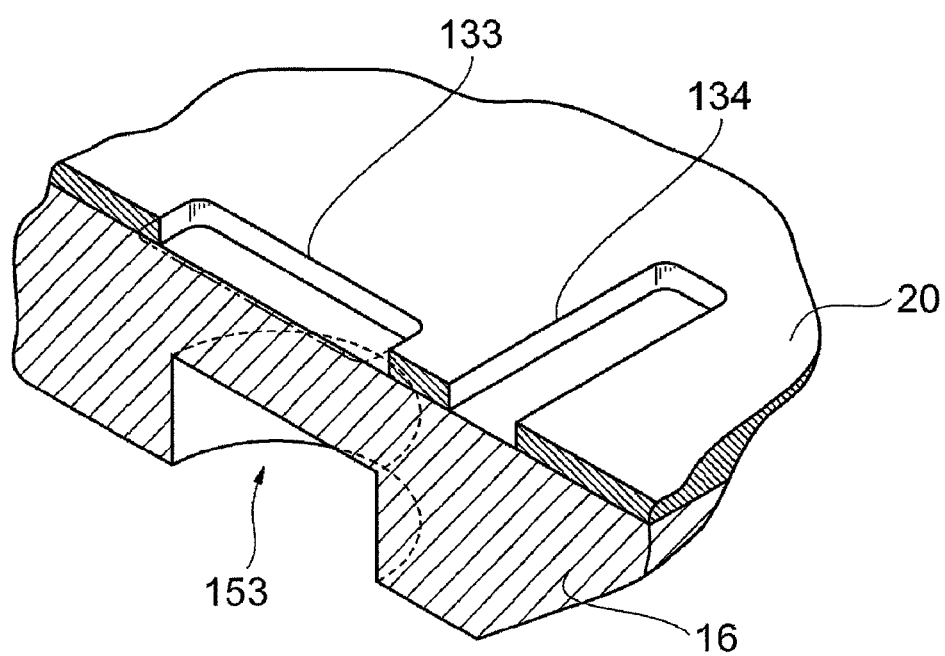
FIG. 14 is a perspective view (a) and a cross sectional view (b) illustrating slots, recesses and their vicinities.
Figure 14:
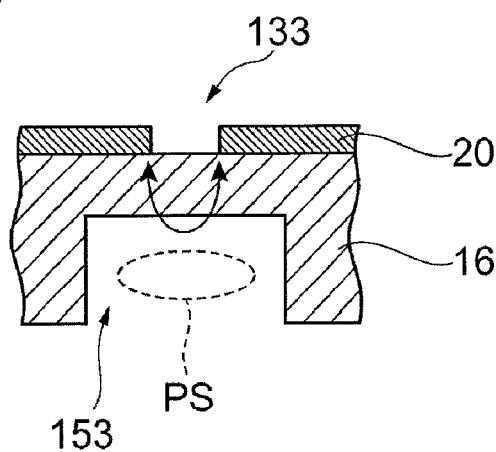

FIG. 14 provides a perspective view (a) and a cross sectional view (b) of the slot 133, the recess 153, and vicinities thereof.

As depicted in FIG. 14(a), the slot 133 is positioned directly above the recess 153. By an electric field generated in the widthwise direction of the slot 133 when microwave is introduced, plasma PS is generated within the recess 153 (FIG. 14(b)).

Figure 15:
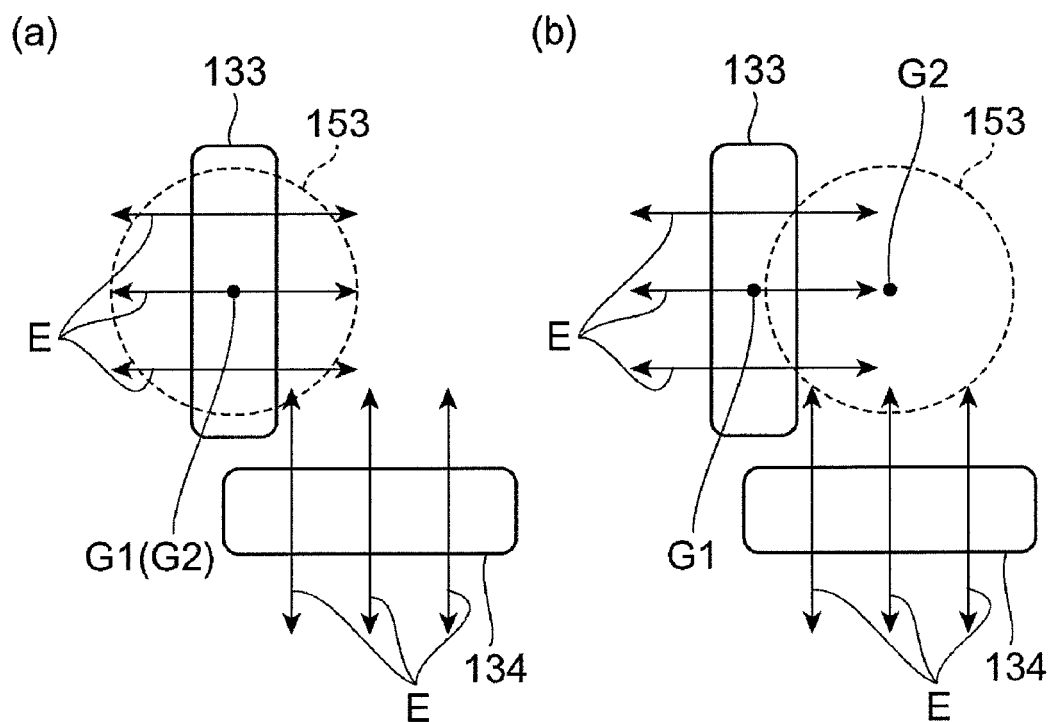
FIG. 15 is a diagram showing a positional relationship between slots and recesses.

FIG. 15 shows a positional relationship between the slot and the second recess.

FIG. 15(a) shows a case where a center position G2 of the recess 153 is set to a position where an electric field E is introduced from the slot 133 selectively. When microwave is introduced, the electric field E is generated in the widthwise direction of the slots 133 and 134. In the present illustrative embodiment, a center position G1 of the slot 133 is matched with the center position G2 of the second recess 153, and the center position G2 of the second recess 153 is located within the slot 133. In this case, since the plasma is securely confined in the second recess 153, there may be caused little fluctuation in the state of the plasma. Further, there is little variation of the plasma state even if various conditions are changed. Especially, since the recess 153 is positioned on the central flat surface 146 (see FIG. 7) the shape of the surface surrounding the recess 153 is uniform. Thus, the degree of the plasma confinement becomes high.

FIG. 15(b) shows a case where the center position G2 of the recess 153 is set to a position where electric fields E are introduced from the both of the slots 133 and 134. That is, FIG. 15(b) shows a case where the center position G1 of the slot 133 is spaced apart from the center position G2 of the second recess 153, and the center position G2 of the second recess 153 is not located within the slot 133. In this case, as compared to the case shown in FIG. 15(a), it becomes more difficult for microwave to enter the recess 153. Accordingly, plasma density may be decreased, so that fluctuation in plasma generation occurs.

Hereinafter, another slot plate will be explained.

Figure 9:
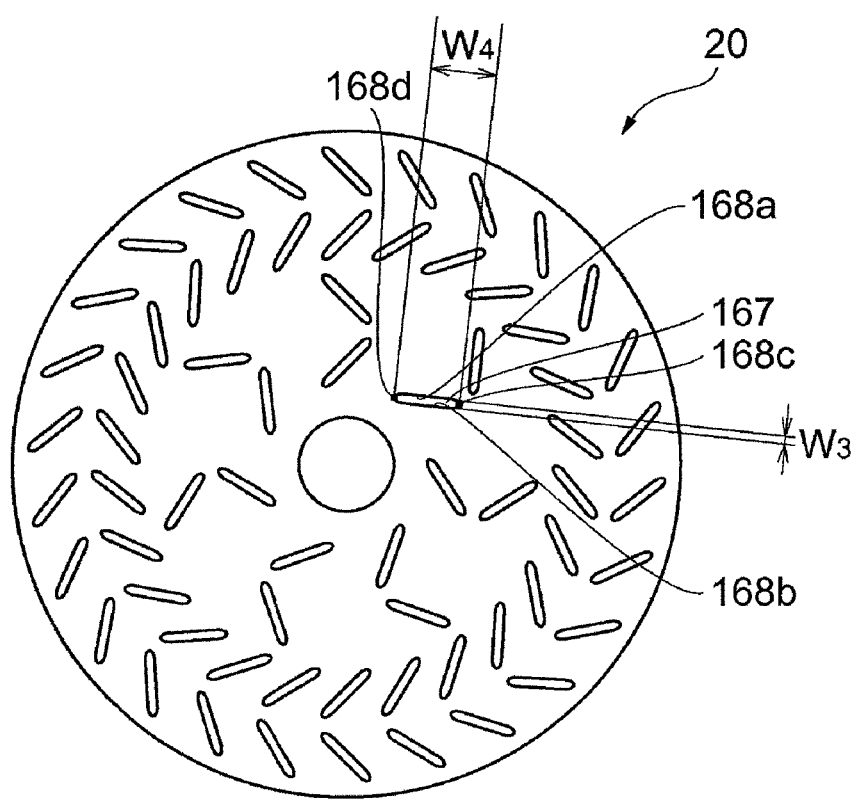
FIG. 9 is a plane view of another slot plate.

FIG. 9 is a plane view of another slot plate.

A slot plate 20 is viewed from a thickness direction thereof. The slot plate 20 has a smaller number of slots than that of the above-described slot plate, and an opening width of a slot 167 is narrowed. The opening width of the slot 167, i.e. a length $W_3$ between one wall portion 168a extended in a lengthwise direction of the slot 167 and the other wall portion 168b extended in the lengthwise direction of the slot 167 is set to, e.g., about 6 mm. This length $W_3$ is about half the length $W_1$ of the slot 133 of the above-described slot plate.

A length $W_4$ of the slot 167, i.e. a length between one end 168c in the lengthwise direction of the slot 167 and the other end 168d in the lengthwise direction of the slot 167 is set to, e.g., about 35 mm. This length $W_4$ is the same as the length $W_2$ of the slot 133 of the above-described slot plate. Regarding the slot 167, a ratio ($W_3/W_4$) is about 6/35, i.e., about ⅙. Since the other structure of the slot is the same as that of the slot plate 20 depicted in FIG. 5, explanations thereof will be omitted.

Herein, as the opening width of the slot is increased, an electric field of the microwave to be introduced is decreased. However, it is possible to reduce the influence caused by deviation of the slot position in the circumferential direction of the slot plate.

If the opening width of the slot becomes smaller, microwave can be radiated more intensely. However, radiation of the microwave may be weakened extremely due to deviation of the slot position in the circumferential direction of the slot plate and non-uniformity in propagation of the microwave. If the opening width of the slot becomes larger, on the other hand, radiation of the microwave would be weakened in overall. However, the radiation of the microwave may not be weakened extremely even if the slot position is deviated in the circumferential direction of the slot plate and the microwave is non-uniformly propagated. That is, as the opening width of the slot is increased, plasma stability is increased.

Figure 10:
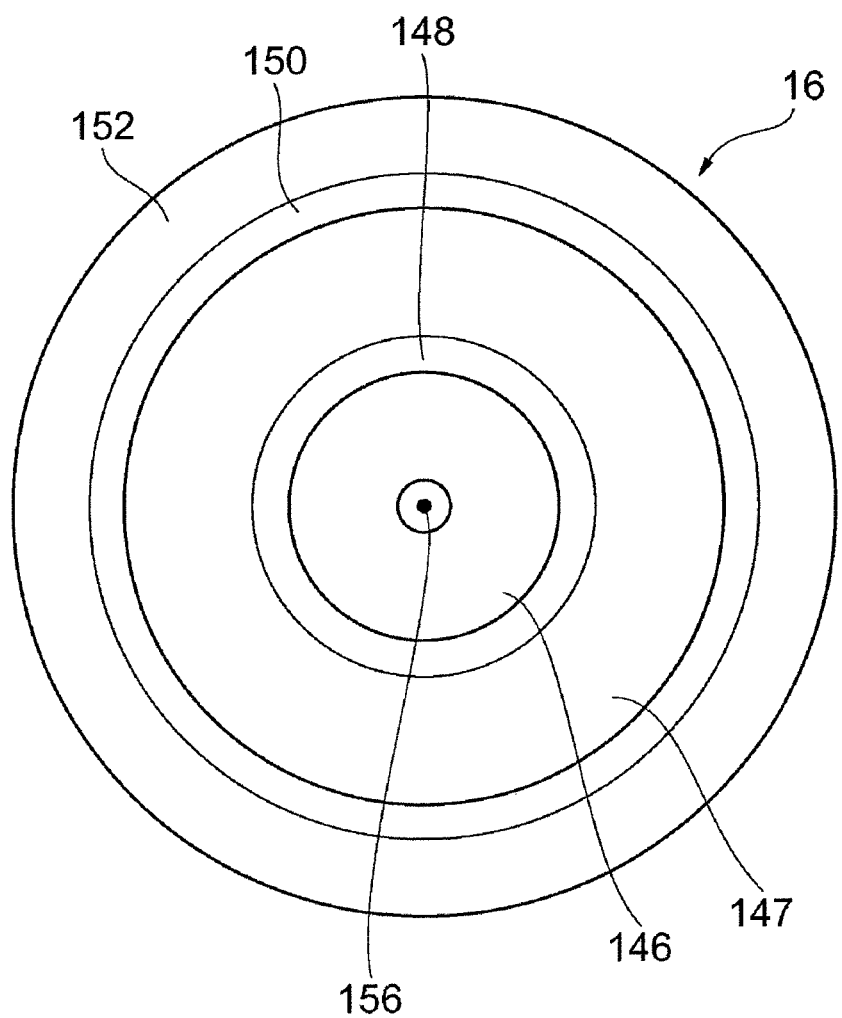
FIG. 10 is a plane view of another dielectric window.

FIG. 10 is a plane view of another dielectric window.

This dielectric window 16 does not include the second recesses formed on the flat surface 146.

Figure 11:
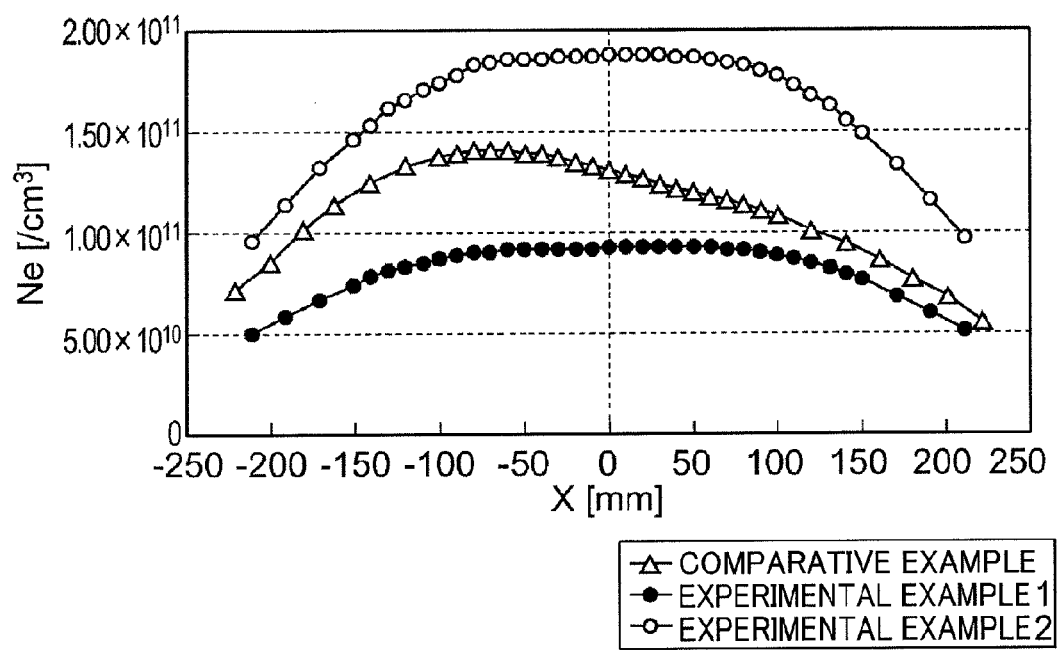
FIG. 11 is a graph showing a relationship between a position X (mm) and an electron density Ne (/cm$^3$)

FIG. 11 is a graph showing a relationship between a position X (mm) and an electron concentration Ne (/cm$^3$).

Experimental example 1 shown in the graph provides data obtained when microwave (about 1000 W) is introduced into the apparatus as depicted in FIG. 1 by using the antenna as depicted in FIG. 7. Experimental example 2 provides data obtained when microwave (about 2000 W) is introduced by using the antenna as depicted in FIG. 7. A comparative example provides data obtained when the dielectric window 16 as depicted in FIG. 10 is combined with the slot plate 20 of FIG. 9 and microwave (about 1500 W) is introduced thereto. Ar and O$_2$ are introduced at a ratio of about 1:1 from a central inlet unit, and an internal pressure of the processing chamber is set to about 10 mTorr=about 1.3 Pa.

In all of the data, as the position X from the center of the antenna increases, the electron concentration Ne (/cm$^3$) of the plasma tends to be decreased. However, in the experimental examples 1 and 2, as compared to the comparative example, at a region close to the center, the electron concentration is flat and has high symmetric property. This indirectly indicates that plasma is securely confined in the second recess as well as in the ring-shaped first recess. It is found out that the above-described structure is effective for generating stable and uniform plasma.

Figure 12:
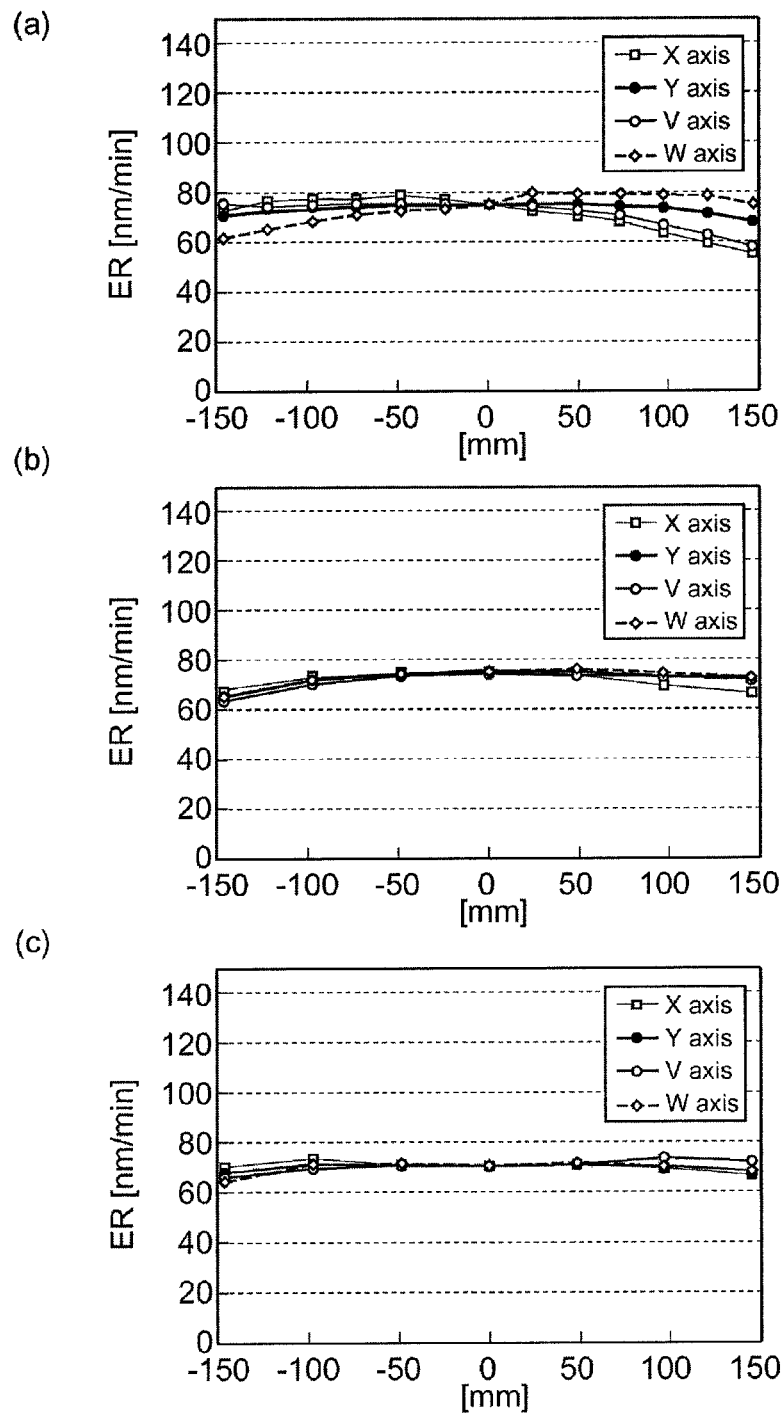
FIG. 12 is a graph showing a relationship between a position (mm) and an etching rate ER (nm/min)

FIG. 12 is a graph showing a relationship between a position (mm) and an etching rate ER (nm/min). An etching target material is SiO$_2$. This graph has a V-axis and a W-axis as well as an X-axis and a Y-axis. The V-axis and the W-axis are at angles of about 45 degrees to the X-axis and the Y-axis, respectively.

FIG. 12(a) provides data obtained when the antenna of the comparative example is used. An internal pressure of the processing chamber is about 10 mTorr=about 1.3 Pa, a microwave power is about 2000 (W) and flow rates of Ar/C$_5$F$_8$ are set to be about 600 (sccm)/about 10 (sccm), respectively. Further, about 20% of an Ar gas is introduced through the central inlet unit and about 80% of the Ar gas is introduced through the peripheral inlet unit. Further, a C$_5$F$_8$ gas of about 10 sccm is introduced into the processing chamber through the peripheral inlet unit. An average etching rate ER is about 71 nm/min and a standard deviation Σ is about 9.1%.

FIG. 12(b) provides data obtained when the antenna as depicted in FIG. 7 is used. An internal pressure of the processing chamber is about 1.3 Pa, a microwave power is about 2000 (W) and flow rates of Ar/C$_5$F$_8$ are set to be about 600 (sccm)/about 10 (sccm), respectively. Further, a mixed gas of Ar and C$_5$F$_5$ is split at a ratio of about 20%:80%, and about 20% of the mixed gas and about 80% of the mixed gas are introduced into the processing chamber through the central inlet unit and the peripheral inlet unit, respectively. An average etching rate ER is about 70 nm/min and a standard deviation Σ is about 4.7%.

FIG. 12(c) provides data obtained when the antenna as depicted in FIG. 7 is used. An internal pressure of the processing chamber is about 1.3 Pa, a microwave power is about 2000 (W) and flow rates of Ar/C$_5$F$_8$ are set to be about 600 (sccm)/about 10 (sccm), respectively. Further, an Ar gas of about 122 (sccm) is introduced through the central inlet unit, and Ar/C$_5$F$_8$ gases of about 478 (sccm)/about 10 (sccm) are introduced through the peripheral inlet unit. An average etching rate ER is about 69 nm/min and a standard deviation Σ is about 3.1%.

Figure 13:
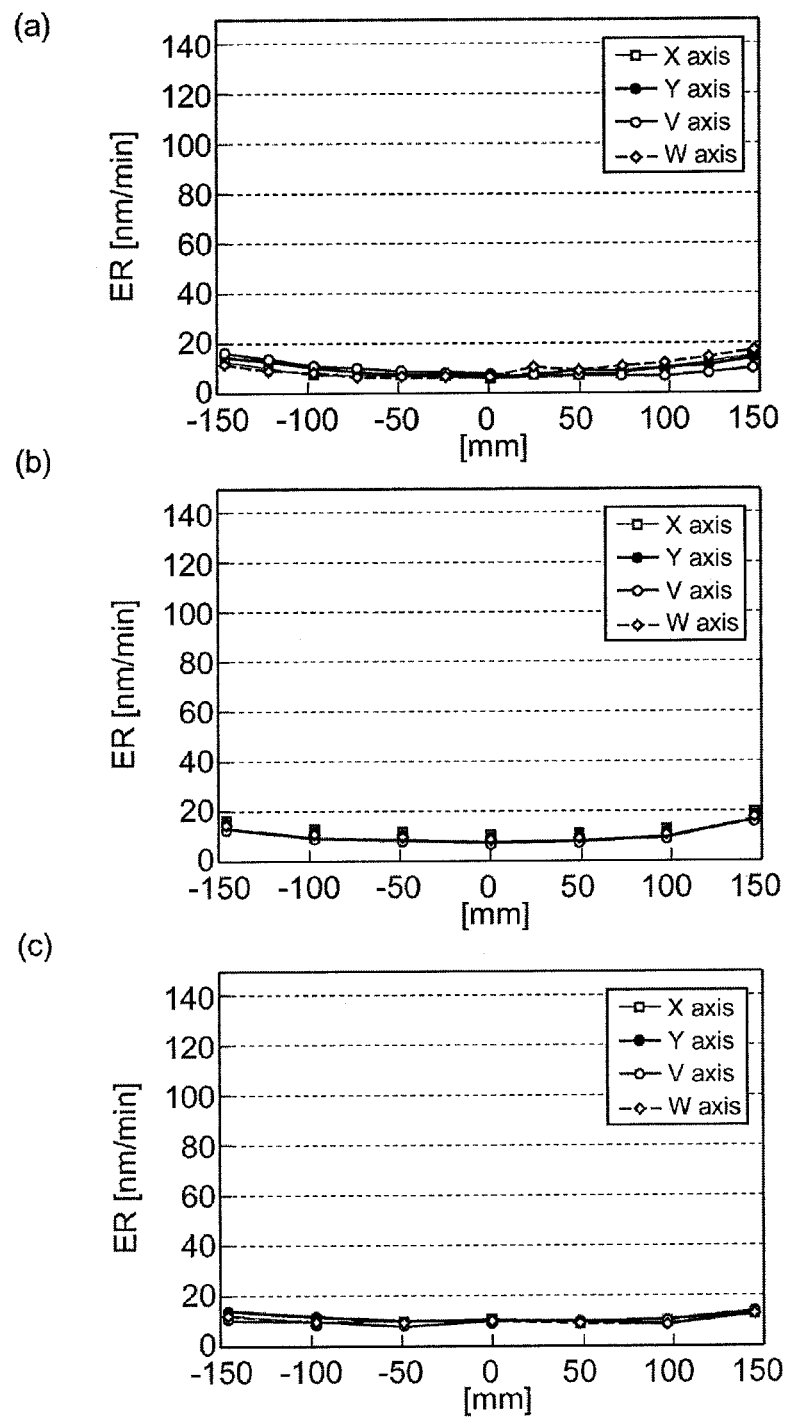
FIG. 13 is a graph showing a relationship between a position (mm) and an etching rate ER (nm/min)

FIG. 13 is a graph showing a relationship between a position (mm) and an etching rate ER (nm/min). An etching target material is SiN. This graph has an X-axis and a Y-axis as well as a V-axis and a W-axis. The V-axis and the W-axis are at angles of about 45 degrees to the X-axis and the Y-axis, respectively.

FIG. 13(a) provides data obtained when the antenna of the comparative example is used. An internal pressure of the processing chamber is about 10 mTorr=1.3 Pa, a microwave power of about 2000 (W), and flow rates of Ar/C$_5$F$_8$ are set to be about 600 (sccm)/about 10 (sccm), respectively. Further, about 20% of an Ar gas is introduced through the central inlet unit and about 80% of the Ar gas is introduced through the peripheral inlet unit. Further, a C$_5$F$_8$ gas of about 10 sccm is introduced into the processing chamber through the peripheral inlet unit. An average etching rate ER is about 11 nm/min and a standard deviation Σ is about 29.1%. An etching selectivity of SiO$_2$ to SiN is about 6.23.

FIG. 13(b) provides data obtained when the antenna as depicted in FIG. 7 is used. An internal pressure of the processing chamber is about 1.3 Pa, a microwave power is about 2000 (W) and flow rates of Ar/C$_5$F$_8$ are set to be about 600 (sccm)/about 10 (sccm), respectively. Further, a mixed gas of Ar and C$_5$F$_8$ is split at a ratio of about 20%:80%, and about 20% of the mixed gas and about 80% of the mixed gas are introduced into the processing chamber through the central inlet unit and the peripheral inlet unit, respectively. An average etching rate ER is about 13 nm/min and a standard deviation Σ is about 24.6%. An etching selectivity of SiO$_2$ to SiN is about 5.28.

FIG. 13(c) provides data obtained when the antenna as depicted in FIG. 7 is used. An internal pressure of the processing chamber is about 1.3 Pa, a microwave power of about 2000 (W) and flow rates of Ar/C$_5$F$_8$ are set to be about 600 (sccm)/about 10 (sccm), respectively. Further, an Ar gas of about 122 (sccm) is introduced through the central inlet unit, and Ar/C$_5$F$_8$ gases of about 478 (sccm)/about 10 (sccm) are introduced through the peripheral inlet unit. An average etching rate ER is about 11 nm/min and a standard deviation Σ is about 16.5%. An etching selectivity of SiO$_2$ to SiN is about 6.28.

As described above, if the antenna as depicted in FIG. 7 is used, a standard deviation Σ can be reduced in etching all the films; and etching can be performed with high etching selectivity. Even if the etching target material is made of silicon or an organic material, the same result can be obtained. In particular, if a C$_5$F$_8$ gas is used, it is possible to control a dissociation state thereof and obtain an effective dissociation for etching. Thus, etching can be performed with high accuracy. Dissociation in a plasma processing apparatus depends on τ×Ne×(σ×v). Here, τ represents a staying time (sec) in plasma, Ne represents an electron concentration (/cm$^3$) of the plasma, σ represents a dissociation cross sectional area (cm$^2$), and v represents an electron velocity (m/sec).

c-C$_4$F$_8$ and L-C$_4$F$_8$ are dissociated in different ways. c-C$_4$F$_8$ is easily decomposed and produces a film made of a lot of radicals and polymers, whereas L-C$_4$F$_8$ is dissociated into two CF$_3$CF and produces a dense film. The c represents a ring shape and the L represents a straight chain shape.

As explained above, the antenna includes the dielectric window 16 and the slot plate 20 provided on one side of the dielectric window 16. On the other side of the dielectric window 16, there are formed the flat surface 146 surrounded by the ring-shaped first recesses and the multiple number of second recesses 153 formed within the flat surface 146 so as to surround the center position of the flat surface 146. Further, as seen from a direction orthogonal to a main surface of the slot plate 20, a center position of each second recess 153 is located within each slot 133 of the slot plate 20.

This antenna allows highly uniform plasma to be generated. Therefore, in a plasma processing apparatus using this antenna, uniformity of a substrate surface processing amount in the surface of a substrate can be increased. This plasma processing apparatus can be used for the film deposition process as well as the etching process.

In the above-described plasma processing method, the common gas source includes a rare gas (Ar gas), and the additive gas source includes $C_5F_8$. Plasma is generated on the other side of the dielectric window by supplying microwave to the slot plate from the microwave generator through the microwave inlet path. The rare gas (Ar gas) is supplied to the central inlet unit from the common gas source via the first split common gas line, and the $C_5F_8$ gas is supplied to the peripheral inlet unit from the additive gas source via the second split common gas line so as to perform, e.g., an etching process onto a substrate on the table. This plasma processing method increases uniformity of a substrate surface processing amount in the surface of the substrate.

In the method shown in FIG. 12(c) and FIG. 13(c), while varying a gas flow rate in the central inlet unit and the peripheral inlet unit, the amount of an additive gas to be supplied to the peripheral inlet unit is controlled. That is, the plasma processing apparatus for performing such plasma processes includes, as depicted in FIGS. 1 and 2, the common gas line 45 connected to the common gas source 41; the flow splitter 44; the central inlet unit 55; the peripheral inlet unit 61; and the additive gas line 48(48'). The flow splitter 44 is provided on the common gas line 45, splits the common gas line 45 into the first and second split common gas lines 46 and 47, and controls a flow rate ratio of the gases flowing through the first and second split common gas lines 46 and 47. The central inlet unit 55 is connected to the first split common gas line 46 and positioned above the central region of the substrate mounted on the table 3. The peripheral inlet unit 61 is connected to the second split common gas line 47 and arranged along a circumferential direction of the space above the substrate, and includes the multiple number of peripheral inlet openings 62 positioned under the dielectric window 16. The additive gas line 48(48') is connected to the additive gas source 42 and at least one of the first and second split common gas lines 46 and 47. The plasma processing apparatus can increase uniformity of the substrate surface processing amount in the surface of the substrate by controlling the flow rate in each gas line.

Figure 16:
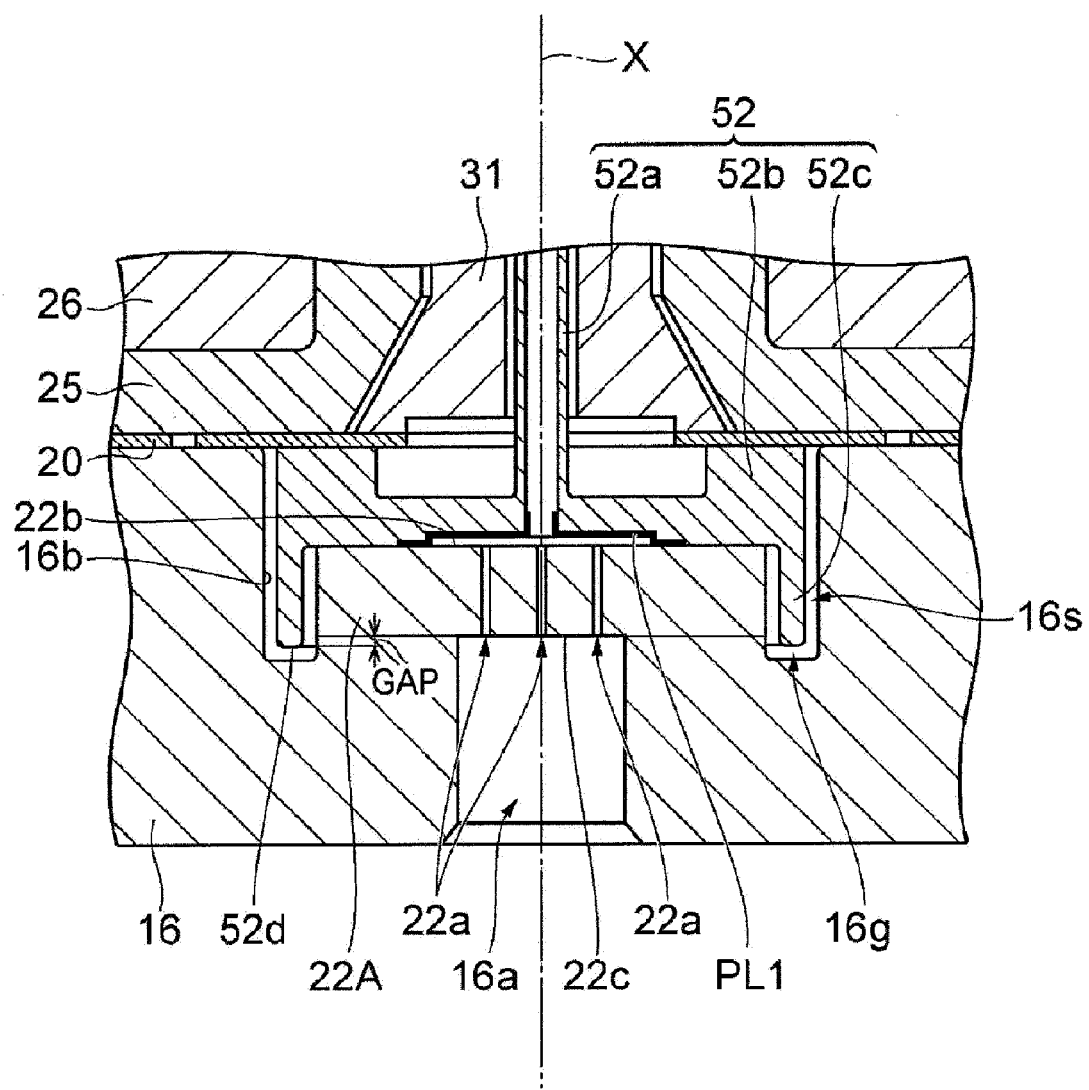
FIG. 16 is a diagram illustrating an improved central inlet unit.

FIG. 16 illustrates an improved central inlet unit. FIG. 16 illustrates an improved portion of an area circled in a dotted line A.

As depicted in FIG. 16, a through hole 16a extended along an axis line X is formed in the dielectric window 16 having a substantially circular plate shape. The through hole 16a has a substantially uniform diameter along the axis line X. The through hole 16a may have a tapered shape tapering to a lower portion. In the dielectric window 16, a space 16s is formed by, e.g., a bottom surface and an inner peripheral surface 16b of the dielectric window 16 extended along the axis line X. Further, the dielectric window 16 also has a ring shaped groove 16g formed to be connected with a lower periphery portion of the space 16s.

The gas supply path (pipeline member) 52 is made of a metal such as stainless steel. The supply path 52 includes a first region 52a, a second region 52b, and a third region 52c. The first region 52a is a pipe extended along the axis line X and is inserted in an inner hole inside the internal conductor 31.

The second region 52b is connected with a lower portion of the first region 52a. The second region 52b has a diameter larger than that of the first region 52a. The second region 52b has a hole connected with the hole inside the first region 52a. The slot plate 20 is held between a lower end of the internal conductor 31 and the second region 52b.

The third region 52c is extended downwardly while connected with a lower periphery portion of the second region 52b. The third section 52c has a ring shape. A lower end of the third region 52c is accommodated in the above-described groove 16g.

An injector 22A is made of a dielectric material. The injector 22A may be provided as a single body with the dielectric window 16 or joined to the dielectric window 16 as a separate member. The injector 22A is positioned at a central portion of the dielectric window 16 and an effective area thereof is formed in a substantially circular plate shape. If the injector 22A is provided as a single body with the dielectric window 16, the injector 22A is made of the same material as the dielectric window 16. In the configuration the injector 22A is joined to the dielectric window 16 as a separate member, the injector 22A may also be made of the same material as the dielectric window 16. If the injector 22A is provided as s single body with the dielectric window 16, it is possible to more securely prevent formation of a gap between the injector 22A and the dielectric window 16. The injector 22A may be made of a bulk dielectric material. The injector 22A may be joined to the dielectric window 16 by, for example, diffusion joint. A dielectric material of the injector 22A may be, for example, quartz or $Y_2O_3$.

The injector 22A includes two surfaces 22b and 22c extended in an orthogonal direction to the axis line X. The surface 22c is positioned opposite to the surface 22b and faces a processing space S (see FIG. 1). The injector 22A also has one or more through holes 22a extended between the surface 22c and the surface 22b. By way of example, the injector 22A configured as described above can be manufactured by performing a machining process on the bulk dielectric material and then, removing a fragmental layer on a surface of the bulk dielectric the material through, e.g., an wet etching process or like in the course of manufacturing the dielectric window. By removing the fragmental layer, the injector 22A can be further stabilized chemically.

The injector 22A is positioned in the space 16s within the dielectric window 16. To be more specific, the injector 22A is positioned in a space formed by a bottom surface of the second region 52b of the supply path 52 and the third region 52c of the supply path 52.

The processing gas from the supply path 52 is supplied into the processing space S through the through hole 22a of the injector 22A and is supplied into the through hole 16a of the dielectric window 16. That is, the injector 22A and the hole 16a of the dielectric window 16 form a path for supplying the processing gas into the processing space S. In this configuration, the processing gas passes through the inside of the injector 22A. Since the injector 22A is made of the dielectric material, the injector 22A is chemically stabilized against the processing gas. Therefore, it is possible to reduce particle generation from the injector 22A.

In the plasma processing apparatus, the third region 52c of the above-described supply path 52 serves as an electric field shield member that encloses the vicinity of the injector 22A. Due to the electric field shield member, plasma generation within the injector 22A becomes more difficult. Therefore, it is possible to further suppress particle generation from the injector 22A.

As described above, the injector 22A is formed as the single body with the dielectric window 16. Thus, it is possible to prevent a gap between the injector 22A and the dielectric window 16 from being formed. Accordingly, it is possible to prevent components of the plasma processing apparatus from being contaminated as a result of a backflow of the processing gas from the processing space S into the space 16s through the gap.

Further, the third region 52c serving as the electric field shield member for the injector 22A may be formed as a part of the supply path 52. That is, the electric field shield member may be formed as a single body with the pipeline for supplying the processing gas into the injector 22A. Thus, a manufacturing process such as assembly and arrangement of the electric field shield member can be simplified.

Further, the third region 52c, i.e. the electric field shield member, may be extended up to a position closer to the processing space S than the surface 22c of the injector 22A in the direction of the axis line X. Thus, electric field intensity in the space where the injector 22A is positioned can be further reduced. As a result, it is possible to further suppress plasma generation in the injector 22A and particle generation from the injector 22A.

There is performed a simulation for investigating a relationship between a distance (GAP) and an electric field intensity in the space where the injector 22A is positioned. Here, the distance (GAP) is a distance between a lower end surface of the electric field shield member (i.e., a lower end surface 52d of the third region 52c) and the surface 22c of the injector 22A in the direction of the axis line X. As a result, it is found out that by locating the lower end surface 52d of the electric field shield member at a lower position than the surface 22c of the injector 22A, the electric field intensity can be reduced and generation of plasma within the injector 22A can be suppressed effectively.

On a lower surface of the second region 52b of the supply path 52 made of stainless steel, a protection layer PL1 made of yttria (yttrium oxide ($Y_2O_3$)) may be formed. The protection layer PL1 protects the second region 52b from plasma or a gas. In order to suppress generation of particles and increase strength of the protection layer PL1, it is desirable to perform a certain process onto the protection layer PL1. That is, it is desirable to irradiate an energy beam such as an electron beam to the protection layer PL1 formed of yttria deposited on the lower surface of the second region 52b, instead of spraying metal yttrium or yttria under an atmosphere containing oxygen or spraying yttria under a depressurized atmosphere. By irradiating the energy beam, the protection layer PL1 is heated and dissolved. Therefore, after being cooled, it can become amorphous. Through this process, the protection layer PL1 is reformed to be improved. In this case, flatness of the protection layer PL1 can be increased, and since gaps between surface particles are filled up, a surface area of the protection layer PL1 can be decreased and resistance against a gas can be further ameliorated.

What is claimed is:

1. A plasma processing apparatus comprising:
    an antenna including a dielectric window and a slot plate which has a plurality of slots;
    a central inlet unit having a central inlet opening positioned at a central portion of the dielectric window and above a central portion of a processing target substrate, the central inlet unit being configured to introduce a first processing gas into a plasma exciting region directly under the dielectric window;
    a peripheral inlet unit arranged along a circumferential direction of a plasma diffusing region under the plasma exciting region and directly above the processing target substrate, the peripheral inlet unit being configured to introduce a second processing gas into the plasma diffusing region;
    a processing chamber for accommodating the antenna therein;
    a table, provided within the processing chamber so as to face a bottom surface of the dielectric window, for mounting the processing target substrate thereon;
    a microwave inlet path that connects a microwave generator with the slot plate,
    wherein the slot plate is provided on a top surface of the dielectric window, the dielectric window and the slot plate have circular plate shapes, and centers of the dielectric window and the slot plate have a same axis,
    wherein the dielectric window comprises:
        a ring shaped first recess formed on the bottom surface of the dielectric window and having a tapered shape inwardly in a plate thickness direction of the dielectric window, and
        a plurality of second recesses formed on a flat surface surrounded by the ring shaped first recess and having circular shapes at a regular interval in a circumferential direction thereof, and
    wherein a diameter of each second recess and a distance from a bottom surface of each second recess to the top surface of the dielectric window are set to be about ¼ of a wavelength of a microwave introduced to the dielectric window,
    when viewed from a thickness direction of the slot plate, a center of each second recess is matched with a center of a corresponding slot of the slot plate, and
    wherein the first processing gas includes a plasma excitation gas, and the second processing gas includes the plasma excitation gas and an etching gas,
    wherein the central inlet unit includes a first through hole formed in the dielectric window and an injector having a plurality of second through holes, and the injector is formed as a single body with the dielectric window, and
    wherein the plurality of second through holes of the injector communicate with the first through hole formed in the dielectric window,
    an electric field shield member enclosing the injector and disposed completely inside the dielectric window, wherein the electric field shield member is extended downwardly to a position that is closer to a processing space than a bottom surface of the injector; and
    a pipeline member being positioned above the injector and connected to an upper portion of the electric field shield member.

2. The plasma processing apparatus of claim 1, wherein the slot plate comprises:
    a first slot group located at a first distance from a center of the slot plate,
    a second slot group located at a second distance from the center of the slot plate,
    a third slot group located at a third distance from the center of the slot plate, and
    a fourth slot group located at a fourth distance from the center of the slot plate;
    wherein the first distance, the second distance, the third distance and the fourth distance satisfy a relationship of the first distance<the second distance<the third distance<the fourth distance, wherein angles between a straight line extended from the center of the slot plate toward a target slot in a diametrical direction and a lengthwise direction of the target slot in the first to the fourth slot groups are identical to each other, wherein a slot of the first slot group and a slot of the second slot group lying on a straight line extended from the center of the slot plate in the diametrical direction are elongated in different directions, wherein a slot of the third slot group and a slot of the fourth slot group lying on a straight line extended from the center of the slot plate in the diametrical direction are elongated in different directions, wherein the number of slots of the first slot group and the number of slots of the second slot group are identical to each other (N1), wherein the number of slots of the third slot group and the number of slots of the fourth slot group are identical to each other (N2), and wherein N2 is an integer multiple of N1.

3. The plasma processing apparatus of claim 1, further comprising:
    a common gas line connected to a common gas source;
    a flow splitter provided on the common gas line, and configured to split the common gas line into a first split common gas line and a second split common gas line and adjust a flow rate ratio between gases flowing in the first split common gas line and the second split common gas line; and
    an additive gas line that connects an additive gas source with at least one of the first split common gas line and the second split common gas line.

4. The plasma processing apparatus of claim 1,
    wherein the central inlet unit comprises:
        a cylindrical block inserted into a cylindrical space of the dielectric window,
        a gas storage portion formed between a bottom surface of an internal conductor of a coaxial waveguide and a top surface of the cylindrical block, and
        a taper-shaped space having an opening, through which the first processing gas is discharged, at a leading end thereof.

5. The plasma processing apparatus of claim 1,
    wherein the first and second processing gases from the central inlet unit and from the peripheral inlet unit are introduced alternately.

6. The plasma processing apparatus of claim 1, wherein the slot plate comprises:
    an inner slot pair group arranged in an inner region of the slot plate and arranged at a regular interval in a circumferential direction of the slot plate so that one slot of each inner slot pair is arranged at a position where each second recess is formed; and
    an outer slot pair group arranged in an outer region of the slot plate and arranged at a regular interval in the circumferential direction of the slot plate.

7. The plasma processing apparatus of claim 1, wherein the first recess has an inner tapered surface, a bottom surface and an outer tapered surface, and
    the inner tapered surface, the bottom surface and the outer tapered surface of the first recess are extended as smooth curved surfaces so that a thickness of the dielectric window varies continually.

8. A plasma processing apparatus comprising:
    an antenna including a dielectric window and a slot plate which has a plurality of slots;
    a central inlet unit having a central inlet opening positioned at a central portion of the dielectric window and above a central portion of a processing target substrate, the central inlet unit being configured to introduce a first processing gas into a plasma exciting region directly under the dielectric window;
    a peripheral inlet unit arranged along a circumferential direction of a plasma diffusing region under the plasma exciting region and directly above the processing target substrate, the peripheral inlet unit being configured to introduce a second processing gas into the plasma diffusing region;
    a processing chamber for accommodating the antenna therein;
    a table, provided within the processing chamber so as to face a bottom surface of the dielectric window, for mounting the processing target substrate thereon;
    a microwave inlet path that connects a microwave generator with the slot plate,
    wherein the slot plate is provided on a top surface of the dielectric window, the dielectric window and the slot plate have circular plate shapes, and centers of the dielectric window and the slot plate have a same axis,
    wherein the dielectric window comprises:
        a ring shaped first recess formed on the bottom surface of the dielectric window and having a tapered shape inwardly in a plate thickness direction of the dielectric window, and
        a plurality of second recesses formed on a flat surface surrounded by the ring shaped first recess and having circular shapes at a regular interval in a circumferential direction thereof,
    wherein a diameter of each second recess and a distance from a bottom surface of each second recess to the top surface of the dielectric window are set to be about ¼ of a wavelength of a microwave introduced to the dielectric window, and
    when viewed from a thickness direction of the slot plate, a center of each second recess is matched with a center of a corresponding slot of the slot plate,
    wherein the slot plate comprises:
        a first slot group located at a first distance from a center of the slot plate,
        a second slot group located at a second distance from the center of the slot plate,
        a third slot group located at a third distance from the center of the slot plate, and
        a fourth slot group located at a fourth distance from the center of the slot plate,
    wherein the first distance, the second distance, the third distance and the fourth distance satisfy a relationship of the first distance<the second distance<the third distance<the fourth distance,
    wherein angles between a straight line extended from the center of the slot plate toward a target slot in a diametrical direction and a lengthwise direction of the target slot in the first to the fourth slot groups are identical to each other,
    wherein a slot of the first slot group and a slot of the second slot group lying on a straight line extended from the center of the slot plate in the diametrical direction are elongated in different directions,
    wherein a slot of the third slot group and a slot of the fourth slot group lying on a straight line extended from the center of the slot plate in the diametrical direction are elongated in different directions, wherein the number of slots of the first slot group and the number of slots of the second slot group are identical to each other,
wherein the number of slots of the third slot group and the number of slots of the fourth slot group are identical to each other,
wherein the first processing gas includes a plasma excitation gas, and the second processing gas includes the plasma excitation gas and an etching gas,
wherein the central inlet unit includes a first through hole formed in the dielectric window and an injector having a plurality of second through holes, and the injector is formed as a single body with the dielectric window, and
wherein the plurality of second through holes of the injector communicate with the first through hole formed in the dielectric window,
an electric field shield member enclosing the injector and disposed completely inside the dielectric window, wherein the electric field shield member is extended downwardly to a position that is closer to a processing space than a bottom surface of the injector, and
a pipeline member being positioned above the injector and connected to an upper portion of the electric field shield member.

\* \* \* \* \*